United States Patent
Park et al.

(10) Patent No.: US 9,558,821 B2
(45) Date of Patent: Jan. 31, 2017

(54) RESISTIVE MEMORY DEVICE AND METHOD OF OPERATING THE SAME

(71) Applicant: SAMSUNG ELECTRONICS CO., LTD., Suwon-si, Gyeonggi-do (KR)

(72) Inventors: Hyun-Kook Park, Anyang-si (KR); Dae-Seok Byeon, Seongnam-si (KR); Yeong-Taek Lee, Seoul (KR); Hyo-Jin Kwon, Seoul (KR); Yong-Kyu Lee, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/645,701

(22) Filed: Mar. 12, 2015

(65) Prior Publication Data
US 2016/0012890 A1    Jan. 14, 2016

(30) Foreign Application Priority Data
Jul. 8, 2014 (KR) ........................ 10-2014-0085363

(51) Int. Cl.
*G11C 11/00* (2006.01)
*G11C 13/00* (2006.01)
*G11C 11/56* (2006.01)
*G11C 11/16* (2006.01)

(52) U.S. Cl.
CPC ....... *G11C 13/0069* (2013.01); *G11C 11/1675* (2013.01); *G11C 11/5607* (2013.01); *G11C 11/5664* (2013.01); *G11C 11/5678* (2013.01); *G11C 11/5685* (2013.01); *G11C 13/0064* (2013.01); *G11C 13/0097* (2013.01); *G11C 2013/0076* (2013.01); *G11C 2213/71* (2013.01)

(58) Field of Classification Search
CPC ............ G11C 13/0069; G11C 11/1675; G11C 11/5678; G11C 11/5685; G11C 11/5664; G11C 11/5607; G11C 2213/71; G11C 2013/0076; G11C 13/0064; G11C 13/0097
See application file for complete search history.

(56) References Cited

U.S. PATENT DOCUMENTS

| | | | |
|---|---|---|---|
| 7,701,770 B2 | 4/2010 | Lee | |
| 7,960,224 B2 | 6/2011 | Chien et al. | |
| 8,125,818 B2 | 2/2012 | Muraoka et al. | |
| 8,184,470 B2 | 5/2012 | Toda et al. | |

(Continued)

OTHER PUBLICATIONS

Jha, Rashmi et al., "Understanding the Switching Mechanism in Transition Metal Oxide Based ReRAM," 2012 IEEE Computer Society Annual Symposium on VLSI, pp. 73-77.

*Primary Examiner* — Richard Elms
*Assistant Examiner* — Mohammed A Bashar
(74) *Attorney, Agent, or Firm* — Volentine & Whitt, PLLC

(57) ABSTRACT

Provided are a resistive memory device and a method of the resistive memory device. The method of operating the resistive memory device includes performing a pre-read operation on memory cells in response to a write command; performing an erase operation on one or more first memory cells on which a reset write operation is to be performed, determined based on a result of comparing pre-read data from the pre-read operation with write data; and performing set-direction programming on at least some memory cells from among the erased one or more first memory cells and on one or more second memory cells on which a set write operation is to be performed.

18 Claims, 18 Drawing Sheets

(56) References Cited

U.S. PATENT DOCUMENTS

| | | |
|---|---|---|
| 8,223,527 B2 | 7/2012 | Lee et al. |
| 8,514,607 B2 | 8/2013 | Nakura et al. |
| 8,531,865 B2 | 9/2013 | Hosono et al. |
| 2012/0236624 A1 | 9/2012 | Costa et al. |
| 2013/0254498 A1* | 9/2013 | Adachi ................. G06F 9/3004 |
| | | 711/155 |
| 2014/0022848 A1 | 1/2014 | Samachisa et al. |
| 2014/0133214 A1* | 5/2014 | Yim .................... G11C 13/004 |
| | | 365/148 |

* cited by examiner

FIG. 6A
<Upper State Write>
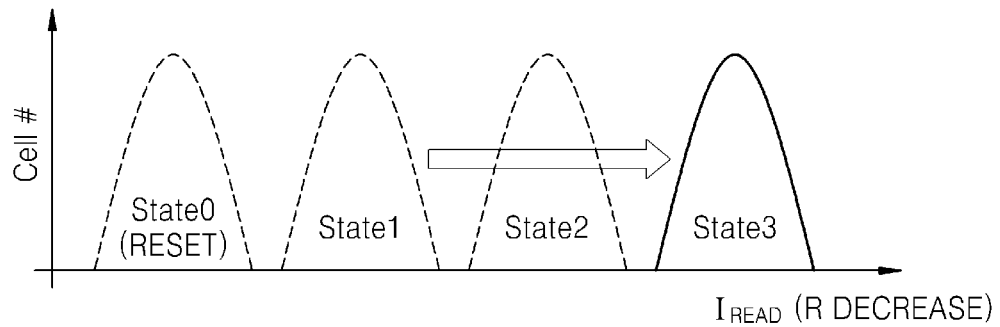
FIG. 6B
<Lower State Write>
<Erase>
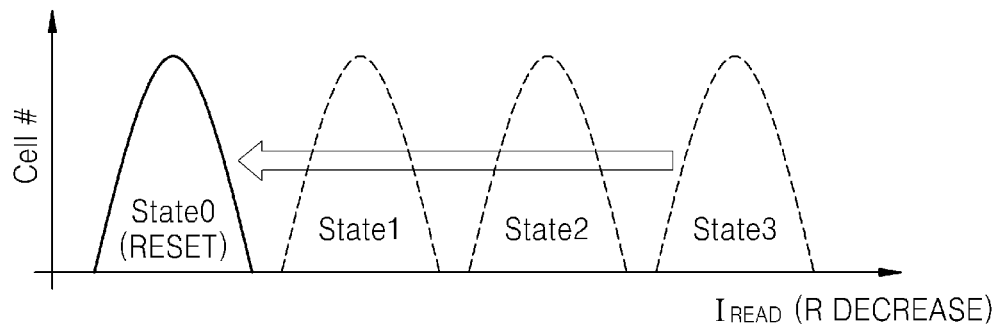
<Program>
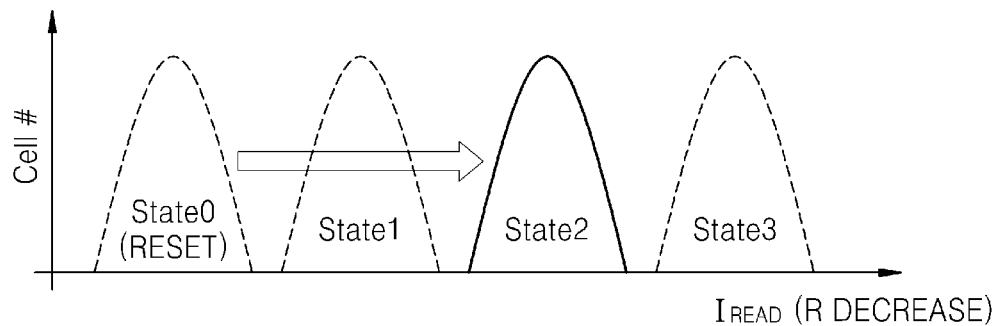

FIG. 12A
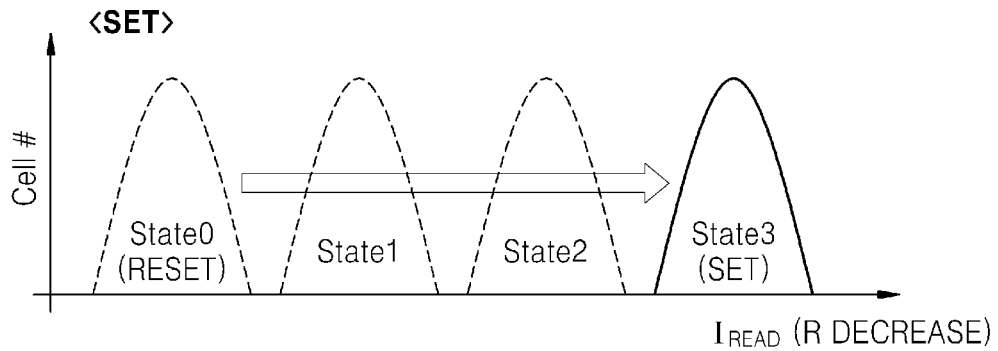
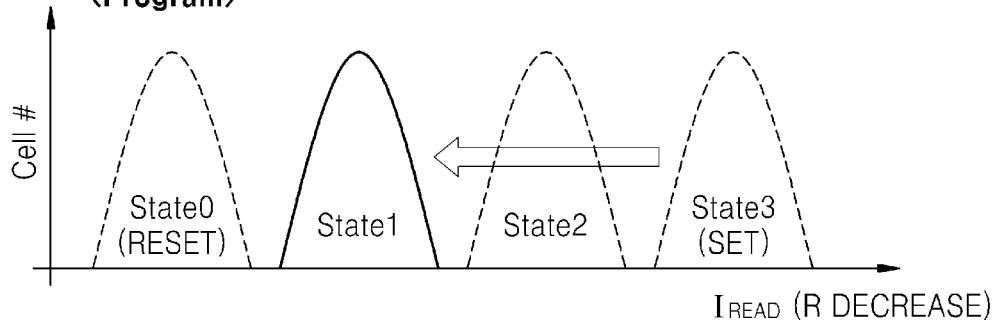
FIG. 12B
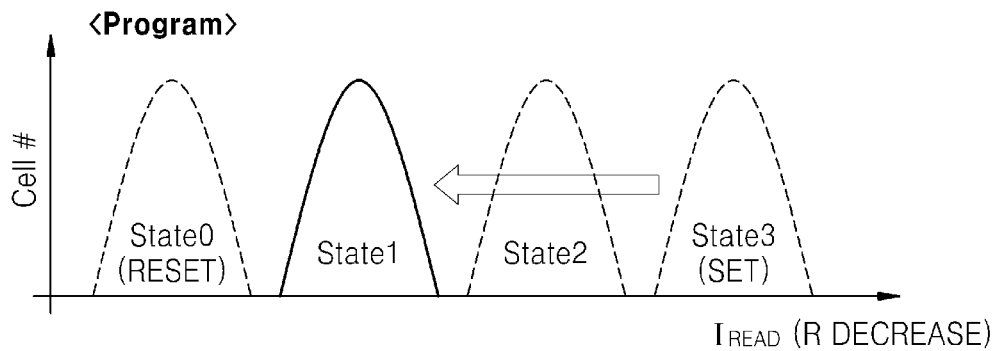

FIG. 14A
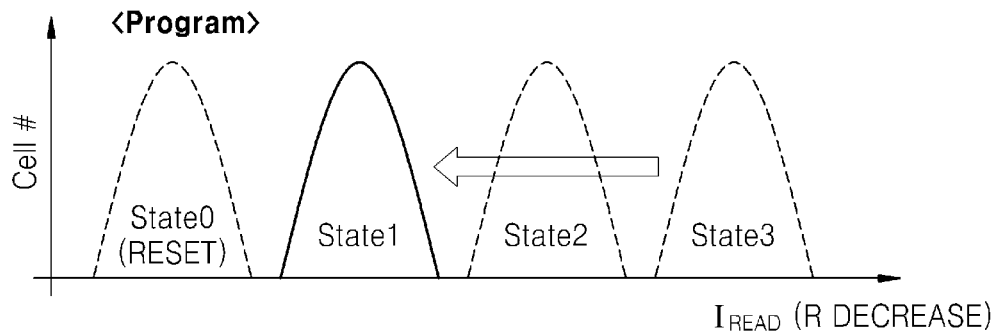
FIG. 14B
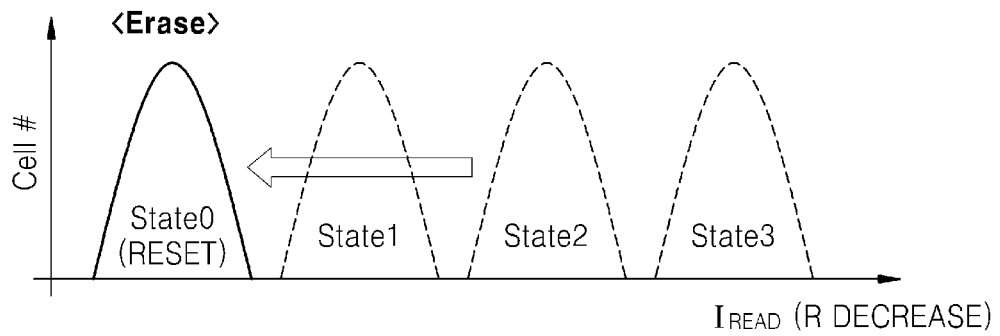
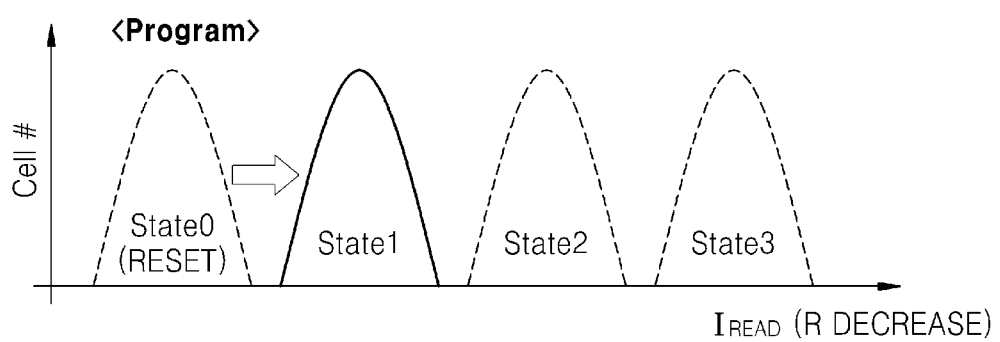

RESISTIVE MEMORY DEVICE AND METHOD OF OPERATING THE SAME

CROSS-REFERENCE TO RELATED APPLICATIONS

A claim for priority under 35 U.S.C. §119 is made to Korean Patent Application No. 10-2014-0085363, filed on Jul. 8, 2014, in the Korean Intellectual Property Office, the entire contents of which are hereby incorporated by reference.

BACKGROUND

Embodiments of the inventive concept relate to a resistive memory device and an operating method of the resistive memory device. More particularly, embodiments of the inventive concept relate to a resistive memory device that includes a resistive memory cell, and an operating method of the resistive memory device.

According to demand for increasingly high capacity and low power consumption memory devices, research for next-generation memory devices is being conducted. The next-generation memory devices must have high integrity characteristics of Dynamic Random Access Memory (DRAM), non-volatile characteristics of flash memory, and high speed characteristics of static RAM (SRAM). As next-generation memory devices, Phase change RAM (PRAM), Nano Floating Gate Memory (NFGM), Polymer RAM (PoRAM), Magnetic RAM (MRAM), Ferroelectric RAM (FeRAM), and Resistive RAM (RRAM) are being highlighted.

SUMMARY

Embodiments of the inventive concept provide a resistive memory device having improved data reliability, and a method of operating the resistive memory device.

According to an aspect of the inventive concept, there is provided a method of operating a resistive memory device. The method includes performing a pre-read operation on memory cells in response to a write command; performing an erase operation on one or more first memory cells on which a reset write operation is to be performed, determined based on a result of comparing pre-read data from the pre-read operation with write data; and performing set-direction programming on at least some memory cells from among the erased one or more first memory cells and on one or more second memory cells on which a set write operation is to be performed.

Each of the one or more first memory cells and the one or more second memory cells may include a variable resistor. The reset write operation may be a write operation that increases a resistance value of the variable resistor, and the set write operation may be a write operation that decreases the resistance value of the variable resistor.

The resistance values of the variable resistors of the one or more first memory cells may be increased by the erase operation, and then decreased by the set-direction programming, whereby the reset write operation is performed on the one or more first memory cells. Resistance values of the variable resistors of the one or more second memory cells may be decreased by the set-direction programming, whereby the set write operation is performed on the one or more second memory cells.

Each of the one or more first memory cells and the one or more second memory cells may be a multilevel cell having a resistance value that corresponds to one of multiple resistance distributions. By performing the erase operation, the one or more first memory cells may have resistance values that correspond to a largest resistance distribution from among the multiple resistance distributions.

Each of the one or more first memory cells and the one or more second memory cells may be a multilevel cell having a resistance value that corresponds to one of multiple resistance distributions. According to a result of comparing the pre-read data with the write data, when a resistance value that corresponds to the write data is greater than a resistance value that corresponds to the pre-read data, a memory cell for storing the write data is determined to be a first memory cell, and when the resistance value that corresponds to the write data is smaller than the resistance value that corresponds to the pre-read data, the memory cell for storing the write data is determined to be a second memory cell.

The method of operating the resistive memory device may further include performing a verification read operation on the at least some memory cells on which the set-direction programming has been performed. According to a verification result, the set-direction programming may be again performed on one or more verification-failed memory cells.

The method of operating the resistive memory device may further include performing a verification read operation on the at least some memory cells on which the set-direction programming has been performed. According to a verification result, the erase operation and the set-direction programming may be again performed on one or more verification-failed first memory cells.

A write operation may be skipped with respect to one or more third memory cells in which the write data is determined to be equal to the pre-read data based on the result of comparing the pre-read data from the pre-read operation with the write data.

According to another aspect of the inventive concept, there is provided method of operating a resistive memory device including multiple resistive memory cells. The method includes performing a pre-read operation on the resistive memory cells, in response to a write command; increasing a resistance value of a first variable resistor in one or more first memory cells, and then performing set-direction programming that decreases the resistance value of the first variable resistor; and performing set-direction programming that decreases a resistance value of a second variable resistor in one or more second memory cells.

According to another aspect of the inventive concept, there is provided a method of operating a resistive memory device including a memory cell array having multiple resistive memory cells, where each of the resistive memory cells includes a variable resistor. The method includes comparing multiple pieces of write data to be written to the resistive memory cells, respectively, with multiple pieces of data that are read from the resistive memory cells, respectively; determining a first cell region of the memory cell array that includes resistive memory cells of which resistance values of the variable resistors are to be increased by a write operation, and a second cell region of the memory cell array that includes resistive memory cells of which resistance values of the variable resistors are to be decreased by the write operation; changing the resistance values of the variable resistors of the resistive memory cells in one of the first cell region and the second cell region, and thus making the resistance values the same; and programming the first cell region and the second cell region, according to the multiple pieces of write data.

According to another aspect of the inventive concept, there is provided a resistive memory device including a memory cell array having resistive memory cells, and control logic. The control logic is configured to control a pre-read operation to be performed on the resistive memory cells in response to a write command, to control an erase operation to be performed on one or more first resistive memory cells on which a reset write operation is to be performed as determined according to pre-read data and write data, and to control set-direction programming to be performed on at least some resistive memory cells from among the erased one or more first resistive memory cells and on one or more second resistive memory cells on which a set write operation is to be performed.

BRIEF DESCRIPTION OF THE DRAWINGS

Exemplary embodiments of the inventive concept will be more clearly understood from the following description taken in conjunction with the accompanying drawings, in which:

FIGS. 6A and 6B are graphs that show examples in which states of memory cells vary according to a write operation, according to embodiments of the inventive concept;

FIGS. 12A and 12B are graphs that show examples in which states of memory cells vary, according to embodiments of the inventive concept;

FIGS. 14A and 14B are graphs that show a write operation, according to embodiments of the inventive concept;

DETAILED DESCRIPTION OF THE EMBODIMENTS

Figure 1:
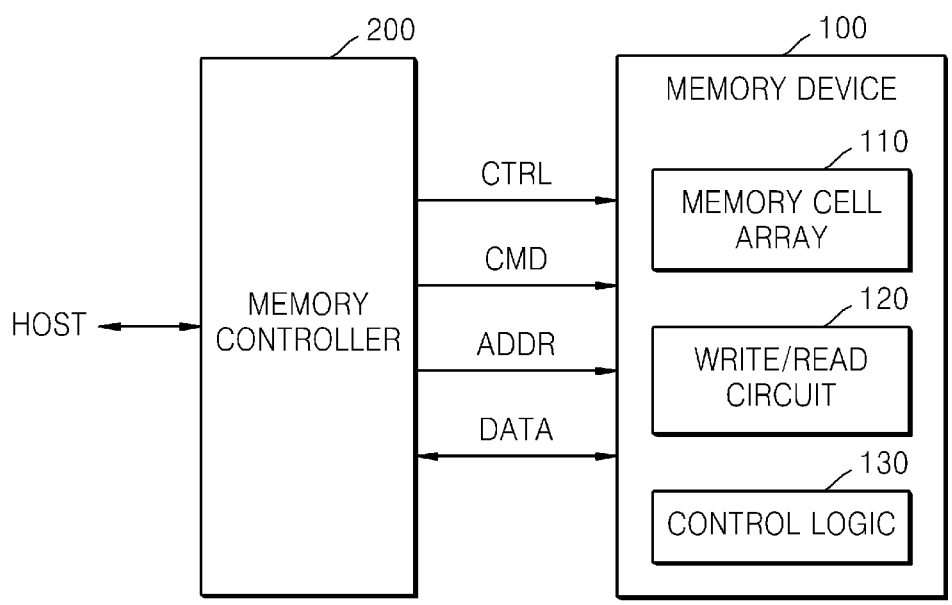
FIG. 1 is a block diagram of a memory system including a resistive memory device, according to an embodiment of the inventive concept.

Embodiments will be described in detail with reference to the following description and accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to one of ordinary skill in the art. Thus, the inventive concept may include all revisions, equivalents, or substitutions which are included in the concept and the technical scope related to the present inventive concept. Also, known processes, elements, and techniques are not described with respect to some of the embodiments. Unless otherwise noted, like reference numerals denote like elements throughout the attached drawings and written description, and thus descriptions may not be repeated. In the drawings, the dimension of structures may be exaggerated for clarity. In the drawings, the dimension of structures may be exaggerated for clarity.

Furthermore, all examples and conditional language recited herein are to be construed as being without limitation to such specifically recited examples and conditions. Throughout the specification, a singular form may include plural forms, unless there is a particular description contrary thereto. Also, terms such as "comprise" or "comprising" are used to specify existence of a recited form, a number, a process, an operation, a component, and/or groups thereof, not excluding the existence of one or more other recited forms, one or more other numbers, one or more other processes, one or more other operations, one or more other components and/or groups thereof.

While terms "first" and "second" are used to describe various components, it is obvious that the components are not limited to the terms "first" and "second". The terms "first" and "second" are used only to distinguish between each component. For example, a first component may indicate a second component or a second component may indicate a first component without conflicting with the inventive concept.

Unless expressly described otherwise, all terms including descriptive or technical terms which are used herein should be construed as having meanings that are obvious to one of ordinary skill in the art. Also, terms that are defined in a general dictionary and that are used in the following description should be construed as having meanings that are equivalent to meanings used in the related description, and unless expressly described otherwise herein, the terms should not be construed as being ideal or excessively formal.

As used herein, the term "and/or" includes any and all combinations of one or more of the associated listed items. Expressions such as "at least one of," when preceding a list of elements, modify the entire list of elements and do not modify the individual elements of the list. The term "exemplary" refers to an illustration or an example.

FIG. 1 is a block diagram of a memory system including a resistive memory device, according to an embodiment of the inventive concept.

Referring to FIG. 1, a memory system 10 includes a resistive memory device 100 (hereinafter, referred as the memory device 100) and a memory controller 200. The memory device 100 includes a memory cell array 110, a write/read circuit 120, and control logic 130. Since the memory cell array 110 includes resistive memory cells, the memory system 10 may be called a resistive memory system.

In response to a write request from a host, the memory controller 200 controls the memory device 100 to write data to the memory device 100. In response to a read request from the host, the memory controller 200 reads data stored in the memory device 100. In more detail, the memory controller 200 may provide an address ADDR, a command CMD, and a control signal CTRL to the memory device 100, and thus control program (or write) operations, read operations, and erase operations with respect to the memory device 100. Also, write-target data DATA and read data DATA may be exchanged between the memory controller 200 and the memory device 100.

Although not illustrated, the memory controller 200 may include a Random Access Memory (RAM), a processing unit, a host interface, and a memory interface. The RAM may be used as an operation memory of the processing unit. The processing unit may control operations of the memory controller 200. The host interface may implement a protocol for exchanging data between the host and the memory controller 200. For example, the memory controller 200 may communicate with an external source (i.e., the host) by using at least one of various interface protocols, including Universal Serial Bus (USB), Multi-Media memory Card (MMC), Peripheral Component Interconnect Express (PCI-E), Advanced Technology Attachment (ATA), Serial-ATA, Parallel-ATA, Small Computer System Interface (SCSI), Enhanced Small Disk Interface (ESDI), and Integrated Drive Electronics (IDE), for example.

The memory cell array 110 may include a plurality of memory cells (not shown) that are disposed respectively in regions where first signal lines and second signal lines cross. In the present embodiment, the first signal lines may be bit lines, and the second signal lines may be word lines. In another embodiment, the first signal lines may be word lines, and the second signal lines may be bit lines.

In the present embodiment, each of the memory cells may be a single level cell (SLC) that stores one bit data, or may be a multilevel cell (MLC) that stores at least two-bit data. Alternatively, the memory cell array 110 may include both the SLC and the MLC. When one bit data is written to one memory cell, the memory cells has two resistance level distributions according to the written data. Alternatively, when two-bit data is written to one memory cell, the memory cell has four resistance level distributions according to the written data. In an embodiment, if a memory cell is a triple level cell (TLC) that stores three-bit data, the memory cells has eight resistance level distributions according to the written data. However, the various embodiments of the inventive concept are not limited thereto. Thus, in other embodiments, each of the memory cells may store at least four-bit data.

In the present embodiment, the memory cell array 110 may include memory cells in a two-dimensionally horizontal structure. In an embodiment, the memory cell array 110 may include memory cells in a three-dimensionally vertical structure.

The memory cell array 110 may include resistance-type memory cells or resistive memory cells that include a variable resistor device (not shown) having a variable resistor. For one example, when resistance of the variable resistor device, which is formed of a phase change material (e.g., Ge—Sb—Te), is changed according to temperature, the resistive memory device is a Phase change RAM (PRAM). For another example, when the variable resistor device is formed of complex metal oxide including an upper electrode, a lower electrode, and transition metal oxide therebetween, the resistive memory device is a Resistive RAM (RRAM). For another example, when the variable resistor device is formed of an upper electrode of a magnetic material, a lower electrode of the magnetic material, and a dielectric therebetween, the resistive memory device is a Magnetic RAM (MRAM).

The write/read circuit 120 performs write and read operations on the memory cells. The write/read circuit 120 is connected to the memory cells via the bit lines, and includes a write driver that writes data to the memory cells, and a sense amplifier that amplifies data read from the memory cells.

The control logic 130 generally controls the operations of the memory device 100, and controls the write/read circuit 120 so as to perform memory operations, such as write operations and read operations. For the write and read operations of the memory device 100, the control logic 130 may provide various pulse signals such as a write pulse, a read pulse, etc., to the write/read circuit 120, and in response to the various pulse signals, the write/read circuit 120 may provide a write current (or a write voltage) or a read current (or a read voltage) to the memory cell array 110. A pulse generator (not shown) that generates the various pulse signals may be arranged in or outside the control logic 130.

In the write operation with respect to the memory device 100, resistance values of variable resistors of some memory cells of the memory cell array 110 are increased, and resistance values of variable resistors of other memory cells of the memory cell array 110 are decreased, depending on the write data. For example, each of the memory cells of the memory cell array 110 has a resistance value according to data that is currently stored therein, and the resistance value may be increased or decreased, depending on data to be written to each of the memory cells. The write operation is divided into a reset write operation and a set write operation. In a set state, a resistive memory cell may have a relatively low resistance value, and in a reset state, the resistive memory cell may have a relatively high resistance value. The reset write operation involves performing a write operation so as to increase the resistance values, and the set write operation involves performing a write operation so as to decrease the resistance values.

In the present embodiment, a writing method varies in the reset write operation and the set write operation, so that durability of the memory device 100 may be improved, and power consumption by the write operation may be decreased. For example, the memory device 100 may determine some memory cells (e.g., first memory cells) on which the reset write operation will be performed, and other memory cells (e.g., second memory cells) on which the set write operation will be performed, where the some memory cells and the other memory cells are from among the memory cells on which the memory operation will be performed. As a result of the determination, the memory device 100 may distinguish between the first memory cells and the second memory cells, and perform the write operation. For example, the memory device 100 first performs an erase operation on the first memory cells and thus increases resistance values of variable resistors of the first memory cells. Then, the memory device 100 performs a program (e.g., set-direction programming) for decreasing the resistance values of the variable resistors of the first memory cells, so that data is written to the first memory cells.

On the other hand, the memory device 100 skips the erase operation on the second memory cells and performs only a program for decreasing resistance values of variable resistors of the second memory cells, so that the set write operation is performed.

The memory device 100 may perform the set-direction programming only on some first memory cells from among the first memory cells. For example, when the memory device 100 performs a write operation by increasing the resistance values of the variable resistors of the first memory cells, the memory device 100 increases resistance values of variable resistors of some first memory cells from among the first memory cells by erasing the some first memory cells. If the resistance values of the some first memory cells at an erase state are equal to resistance values of the variable resistors of the some first memory cells on which the reset write operation is performed, the set-direction programming may be skipped on the some first memory cells.

In the write operation according to the present embodiment, it is not necessary to perform an erase operation on all memory cells on which the write operation will be performed. It is therefore possible to increase durability of the memory device 100 by reducing deterioration due to the number of times that erase operations are performed. Also, it is possible to decrease the number of memory cells on which the erase operation that requires great power consumption is performed, and thus entire power consumption may be reduced.

The memory controller 200 and the memory device 100 may be integrated into a semiconductor device. For example, the memory controller 200 and the memory device 100 may be integrated into a semiconductor device configured as a memory card. Also, for example, the memory controller 200 and the memory device 100 may be integrated into a semiconductor device configured as a personal computer (PC) card (e.g., a PCMCIA card), a compact flash card (CF card), a smart media card (SM/SMC), a memory stick, a multimedia card (MMC, RS-MMC, or MMCmicro), an SD card (SD, miniSD, or microSD), or a universal flash storage (UFS). As another example, the memory controller 200 and the memory device 100 may be integrated into the semiconductor device configured as a Solid State Disk/Drive (SSD).

Figure 2:
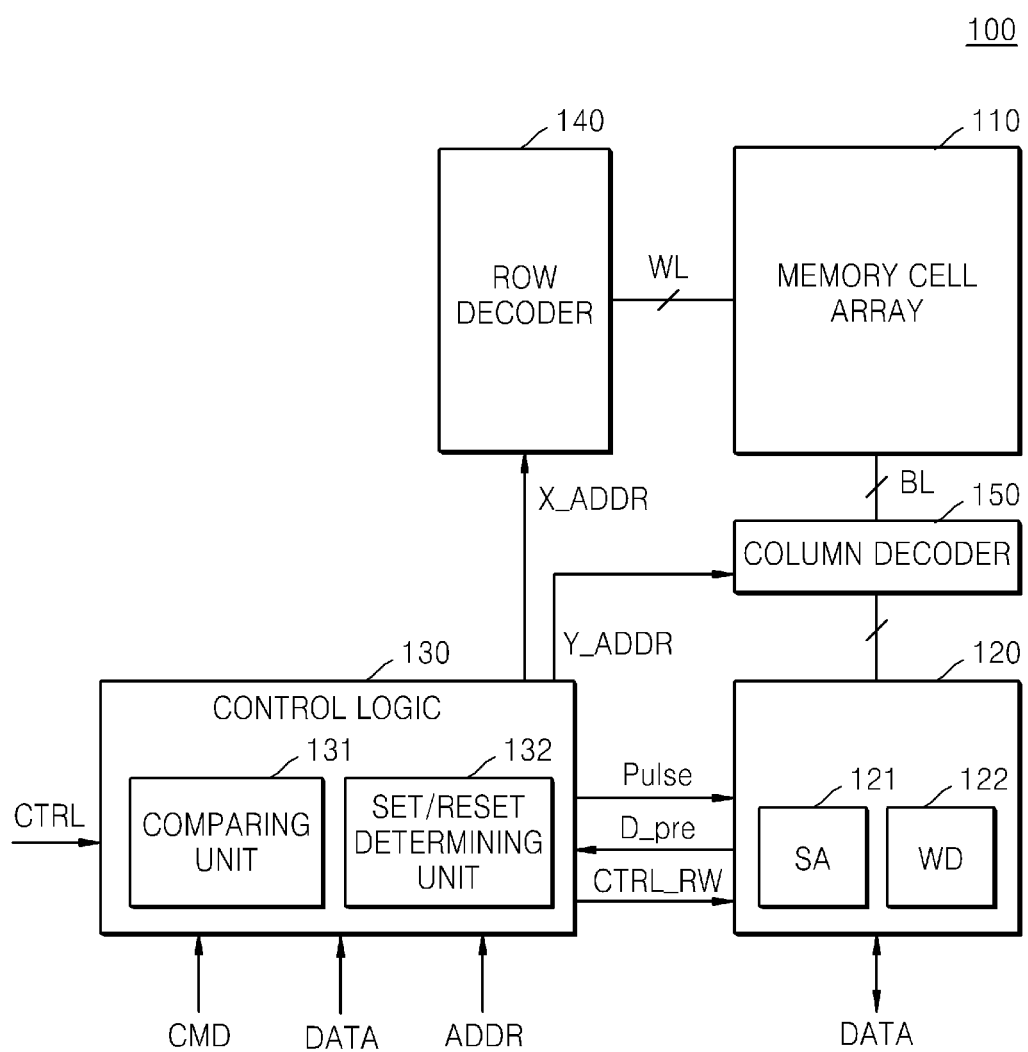
FIG. 2 is a block diagram of the memory device of FIG. 1, according to an embodiment of the inventive concept.

An operation of the memory device 100 included in the resistive memory system 10 with the aforementioned structure will be described below. FIG. 2 is a block diagram of the memory device 100 of FIG. 1, according to an embodiment of the inventive concept.

Referring to FIG. 2, the memory device 100 includes the memory cell array 110, the write/read circuit 120, and the control logic 130. Also, the memory device 100 further includes a row decoder 140 and a column decoder 150. The write/read circuit 120 includes a sense amplifier 121 and a write driver 122. In the present embodiment, the control logic 130 includes a comparing unit 131 and a set/reset determining unit 132 to control a set write operation and a reset write operation. Referring to FIG. 2, the comparing unit 131 and the set/reset determining unit 132 are included in the control logic 130, but other embodiments of the inventive concept are not limited thereto. For example, a unit that performs a function of at least one of the comparing unit 131 and the set/reset determining unit 132 may be arranged outside the control logic 130, and a comparison result and/or a set/reset determination result may be provided to the control logic 130. For example, a unit of performing a comparison function and a unit of performing a set/reset determination function may be arranged in the write/read circuit 120.

A structure and operations of the memory device 100 shown in FIG. 2 are as below.

Memory cells that are arranged in the memory cell array 110 may be connected to first signal lines and second signal lines. The first signal lines may be bit lines BL, and the signal lines may be word lines WL, for example. When a write command is received, a reset write operation may be performed on memory cells of a region (e.g., a first cell region) of the memory cell array 110, and a set write operation may be performed on memory cells of another region (e.g., a second cell region) of the memory cell array 110.

An address ADDR accompanying the write command is received to indicate a memory cell. The address ADDR may include a row address X_ADDR for selecting a word line WL of the memory cell array 110, and a column address Y_ADDR for selecting a bit line BL of the memory cell array 110. The row decoder 140 performs a word line selecting operation in response to the row address X_ADDR, and the column decoder 150 performs a bit line selecting operation in response to the column address Y_ADDR.

The write/read circuit 120 is connected to the bit line BL, and thus writes data to the memory cell or reads data from the memory cell. For example, the write/read circuit 120 may receive a write pulse Pulse from the control logic 130, and the write driver 122 may provide a write voltage or a write current to the memory cell array 110 via the column decoder 150 according to the received write pulse Pulse. In more detail, when a set pulse is received, the write driver 122 may provide a set current or a set voltage to the memory cell array 110, in response to the set pulse, and thus decrease a resistance value of a variable resistor of the memory cell. When a reset pulse is received, the write driver 122 may provide a reset current or a reset voltage to the memory cell array 110, in response to the reset pulse, and thus increase the resistance value of the variable resistor of the memory cell.

In a read operation of reading data, the write/read circuit 120 generates and provides a read current (or a read voltage) for the read operation to the memory cell. The sense amplifier 121 may include a current generator (or a voltage generator), and in order to determine the data, the sense amplifier 121 may include a comparator that is connected to a node (e.g., a sensing node) of the bit lines BL. Since one end of the comparator is connected to the sensing node, and the other end of the comparator is connected to a reference voltage, the sense amplifier 121 is able to determine the value of the data.

The control logic 130 may output various control signals CTRL_RW for writing data to the memory cell array 110 or reading data from the memory cell array 110, based on a command CMD, an address ADDR, and a control signal CTRL received from the memory controller 200. By doing so, the control logic 130 generally controls operations in the memory device 100.

In response to receipt of the write command, the control logic 130 may control a pre-read operation to be performed on at least some memory cells of the memory cell array 110. Pre-read data D_pre is provided to the comparing unit 131, and the comparing unit 131 compares the pre-read data D_pre with data DATA that is accompanied with the write command. For example, pieces of data may be pre-read from a plurality of access-target memory cells, and values of the pieces of the data D_pre that are pre-read from the access-target memory cells are compared respectively with values of write data DATA to be stored in the access-target memory cells.

The set/reset determining unit 132 (which may alternatively be referred to as "determining unit") determines, based on the comparison results, whether to perform a set write operation or a reset write operation on each of the access-target memory cells. Since the determination may be performed on each memory cell, the access-target memory cells may be divided into first memory cells on which the reset write operation will be performed, and second memory cells on which the set write operation will be performed. The control logic 130 controls, based on the determination result, the reset write operation on the first memory cells and the set write operation on the second memory cells.

In the present embodiment, the reset write operation may be performed by an erase operation and a set-direction programming operation. Also, the set write operation may be performed by a set-direction programming operation with respect to the second memory cells. Accordingly, in response to the write command, the control logic 130 performs the pre-read operation, the comparing operation, and the determining operation, controls the erase operation to be selectively performed on the first memory cells, and then controls the set-direction programming operation to be performed on at least some memory cells from among the first and second memory cells. By doing so, resistance values of variable resistors of the first memory cells are increased according to the erase operation and then are decreased according to the set-direction programming operation, so that the reset write operation is performed on the first memory cells. Also, resistance values of variable resistors of the second memory cells are decreased according to the set-direction programming operation, so that the set write operation is performed on the second memory cells.

Figure 3:
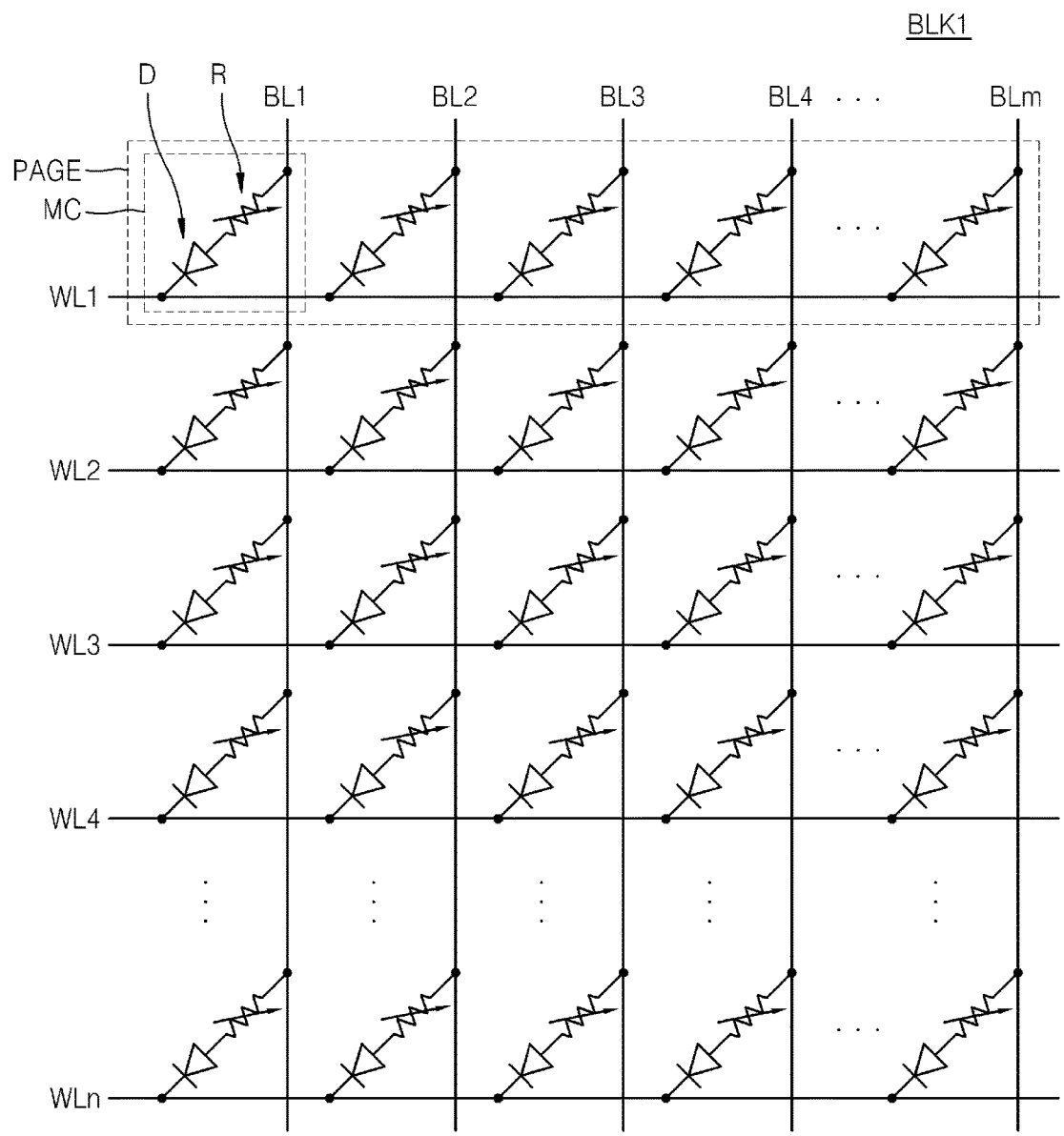
FIG. 3 is a circuit diagram illustrating an example of a memory cell array of FIG. 2.

FIG. 3 is a circuit diagram illustrating an example of the memory cell array 110 of FIG. 2, according to an embodiment of the inventive concept. The memory cell array 110 may include a plurality of cell blocks, and FIG. 3 shows one cell block BLK 1 of the plurality of memory blocks.

Referring to FIG. 3, the cell block BLK 1 includes memory cells in a horizontal structure. Notably, the rest of the cell blocks of the plurality of memory blocks may be embodied in the same manner as the cell block BLK 1 of FIG. 3. The cell block BLK 1 includes a plurality of word lines WL1 through WLn, a plurality of bit lines BL1 through BLm, and a plurality of memory cells MC. The number of the word lines WL, the number of the bit lines BL, and the number of the memory cells MC may vary according to various embodiments. Also, the memory cells MC that are selected by one word line may be defined as a page unit PAGE.

In the present embodiment, each of the plurality of memory cells MC includes a variable resistor R and a selection device D. The variable resistor R may be referred to as a variable resistor device or variable resistor material, and the selection device D may be referred to as a switching device.

In an embodiment, each variable resistor R is connected between one of the bit lines BL1 through BLm and the selection device D, and each selection device D is connected between the variable resistor device R and one of the word lines WL1 through WLn. However, various embodiments of the inventive concept are not limited thereto. For example, the selection device D may be connected between one of the bit lines BL1 through BLm and the variable resistor R, and the variable resistor R may be connected between the selection device D and one of the word lines WL1 through WLn.

In the present embodiment, the variable resistor R may be changed to one of multiple resistive states, in response to an electric pulse applied thereto. For example, the variable resistor R may include a phase-change material, the crystal state of which changes according to current. The phase-change material may include various materials GaSb, InSb, InSe, or Sb2Te3 obtained by compounding two elements, GeSbTe, GaSeTe, InSbTe, SnSb2Te4, or InSbGe obtained by compounding three elements, or AgInSbTe, (GeSn)SbTe, GeSb(SeTe), Te81Ge15Sb2S2 obtained by compounding four elements, for example.

The phase-change material has an amorphous state that is relatively resistive, and a crystal state that is relatively low-resistive. The phase of the phase-change material may be changed by Joule's heat that is generated by the current. Data may be written using the change of the phase.

In an embodiment, the variable resistor R may not include phase-change material, but may include perovskite compounds, transition metal oxide, magnetic materials, ferromagnetic materials, or antiferromagnetic materials, for example.

As mentioned above, the selection device D may be connected between one of the word lines WL1 through WLm and the variable resistor R, and according to a voltage applied to the connected word line and bit line, a current that is supplied to the variable resistor R is controlled. In the present embodiment, the selection device D may be a PN-junction diode or a PIN-junction diode, for example. An anode of the diode may be connected to the variable resistor R, and a cathode of the diode may be connected to one of the word lines WL1 through WLm. Here, when a voltage difference between the anode and the cathode of the diode is greater than a threshold voltage of the diode, the diode is turned on, so that the current may be supplied to the variable resistor R.

Figure 4A:
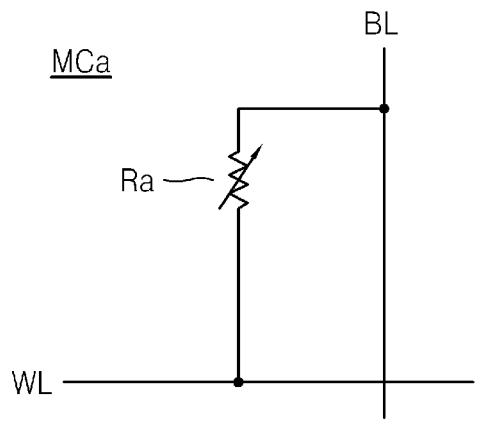
FIGS. 4A through 4C are circuit diagrams of modified examples of a memory cell of FIG. 3.
Figure 4B:
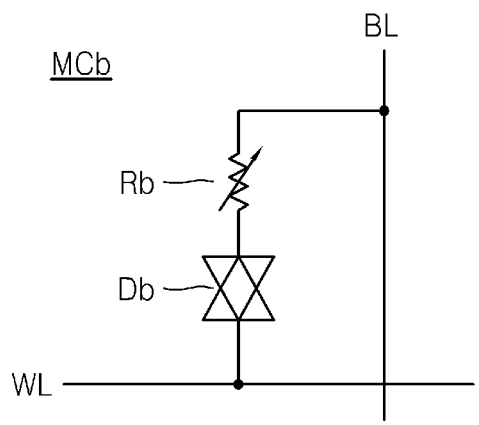
Figure 4C:
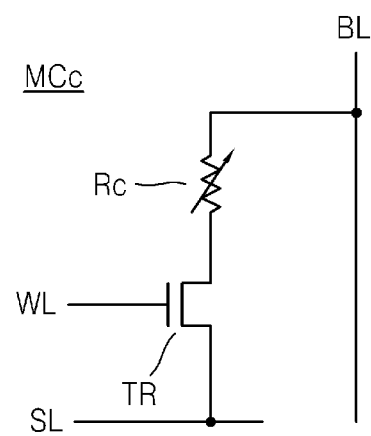

FIGS. 4A through 4C are circuit diagrams of modified examples of a memory cell MC of FIG. 3.

Referring to FIG. 4A, a memory cell MCa includes a variable resistor Ra connected between a bit line BL and a word line WL. The memory cell MCa may store data due to voltages that are applied to the bit line BL and the word line WL, respectively.

Referring to FIG. 4B, a memory cell MCb includes a variable resistor Rb and a bidirectional diode Db. The variable resistor Rb may include a resistive material so as to store data. The bidirectional diode Db connected is between the variable resistor Rb and a word line WL, and the variable resistor Rb is connected between a bit line BL and the bidirectional diode Db. Positions of the bidirectional diode Db and the variable resistor Rb may be changed with respect to each other. Use of the bidirectional diode Db cuts leakage current that may flow a non-selected resistor cell.

Referring to FIG. 4C, a memory cell MCc includes a variable resistor Rc and a transistor TR. The transistor TR may be a selection device, i.e., a switching device that supplies or cuts a current to the variable resistor Rc, according to a voltage of a word line WL. In the embodiment of FIG. 4C, in addition to the word line WL, a source line SL may be additionally arranged to adjust voltage levels at both ends of the variable resistor Rc. The transistor TR is connected between the variable resistor Rc and the source line SL, and the variable resistor R is connected between a bit line BL and the transistor TR. Positions of the transistor TR and the variable resistor Rc may be changed with respect to each other. The memory cell MCc may be selected or not be selected, according to whether the transistor TR that is driven by the word line WL is ON or OFF.

Figure 5:
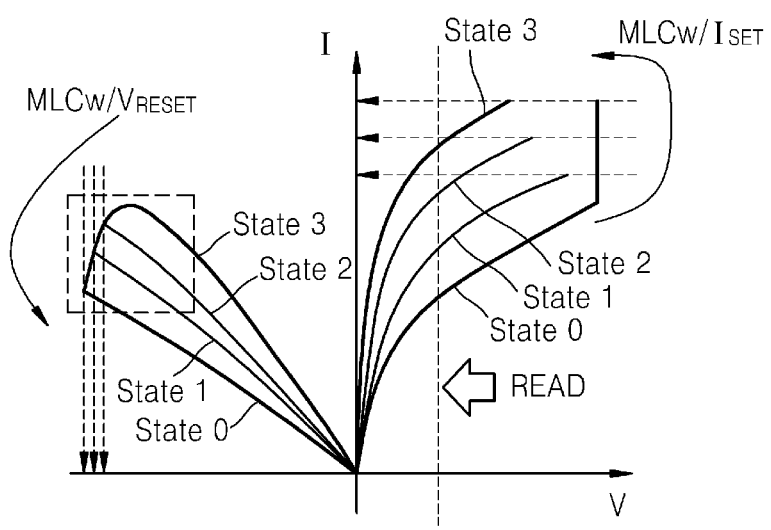
FIG. 5 is a graph that shows current and voltage characteristics of a write operation when a memory cell is a multilevel cell.

FIG. 5 is a graph that shows current and voltage characteristics of a write operation when a memory cell is a multilevel cell. Here, if each of memory cells stores 2-bit data, each of the memory cells may have at least one state among four states (i.e., State 0 through State 3). Also, it is assumed that, when a resistance value of a variable resistor of a memory cell is largest, the memory cell has a low state (i.e., State 0), and when a resistance value of a variable resistor of a memory cell is smallest, the memory cell has a high state (i.e., State 3).

As shown on the right side of the graph of FIG. 5, according to set-direction programming, the resistance value of the variable resistor may be decreased (or, the state of the memory cell may be changed to a higher state among multiple states). In comparison, hand, as shown on the left side of the graph, according to a reset-direction programming, the resistance value of the variable resistor may be increased (or, the state of the memory cell may be changed to a lower state among the multiple states).

Also, as shown on the left side of the graph, when the reset-direction programming is performed, current level sharply varies according to variation of voltage level, such that it is relatively difficult to control the voltage level in order to change each of the states. In other words, that it is relatively difficult to control states in a reset-direction. In comparison, as shown on the right side of the graph, when the set-direction programming is performed, the current values of the different states are relatively far apart. That is, when the set-direction programming is performed by limiting current, the current values for changing states, respectively, have large differences therebetween, so that it is relatively easy to control states in a set-direction.

FIGS. 6A and 6B are graphs that show examples in which states of memory cells vary according to a write operation, according to embodiments of the inventive concept. Regarding FIGS. 6A and 6B, it is assumed that each of the memory cells stores 2-bit data. Also, regarding the examples depicted in FIGS. 6A and 6B, it is assumed that, when a resistance value of a variable resistor of a memory cell is smallest, the memory cell has a high state (i.e., State3), and when a resistance value of a variable resistor of a memory cell is largest, the memory cell has a low state (i.e., State0). In particular, a memory cell having a lowermost state may be defined as a memory cell having an erase state (or a reset state RESET). However, embodiments of the inventive concept are not limited thereto, and it may be defined that the memory cell in the erase state has the highest state.

FIG. 6A shows an example in which states of the memory cells vary by a set write operation. As illustrated in FIG. 6A, each of the memory cells may have a resistance value that corresponds to one of four resistance distributions, according to data that is currently written to the memory cells. Also, since a resistance value of a variable resistor of the memory cell having the erase state (or the reset state) has a largest value, a state of the memory cell may be located farthest left on the graph. In comparison, since a resistance value of a variable resistor of a memory cell having a set state has a smallest value, a state of the memory cell may be located farthest right on the graph.

As shown in the graph showing current and voltage characteristics (FIG. 5), it is relatively easy to control the set-direction programming, so that write data may be overwritten to and may be stored in the memory cells (e.g., the second memory cells) on which the set write operation will be performed. That is, the write operation with respect to the second memory cells may be performed by an overwrite operation, and states of the second memory cells that correspond to currently-stored data may be changed and thus may correspond to the write data. As illustrated in FIG. 6A, when currently-stored data of a memory cell corresponds to a first state (i.e., State1), and write data corresponds to a third state (i.e., State3 or the set state), a state of the memory cell may be changed from the first state (i.e., State1) to the third state (i.e., State3) by the set-direction programming.

FIG. 6B shows an example in which states of the memory cells vary by a reset write operation. As illustrated in FIG. 6B, an erase operation may be first performed on memory cells (e.g., first memory cells) on which the reset write operation will be performed. For example, when currently-stored data of a memory cell corresponds to a third state (i.e., State3), and write data corresponds to a second state (i.e., State2), a state of the memory cell may be changed to an erase state (i.e., State0 or a reset state RESET) by the erase operation. Accordingly, after the erase operation is performed, variable resistors of the first memory cells have a resistance value that corresponds to a largest resistance distribution from among the multiple resistance distributions.

Afterward, set-direction programming is performed on at least some first memory cells of the multiple first memory cells. Since the write data corresponds to the second state (i.e., State2), and states of the erased first memory cells correspond to the erase state (i.e., State0), the states of the first memory cells may be changed from the erase state (i.e., State0) to the second state (i.e., State2) by the set-direction programming. That is, when the reset write operation is first performed on the first memory cells in order to change the states of the first memory cells from the third state (i.e., State3) to the second state (i.e., State2), the program operation then may be performed by changing the states of the first memory cells from the erase state (i.e., State0) to the second state (i.e., State2), making it relatively easier to control the change in the states of the memory cells (in the set-direction).

According to the present embodiment, it is possible to prevent the erase operation from being performed on all memory cells, so that the possibility is decreased that the durability of the memory device 100 deteriorates due to repetition of erase operations, and reliability of a data write operation is improved.

Figure 7:
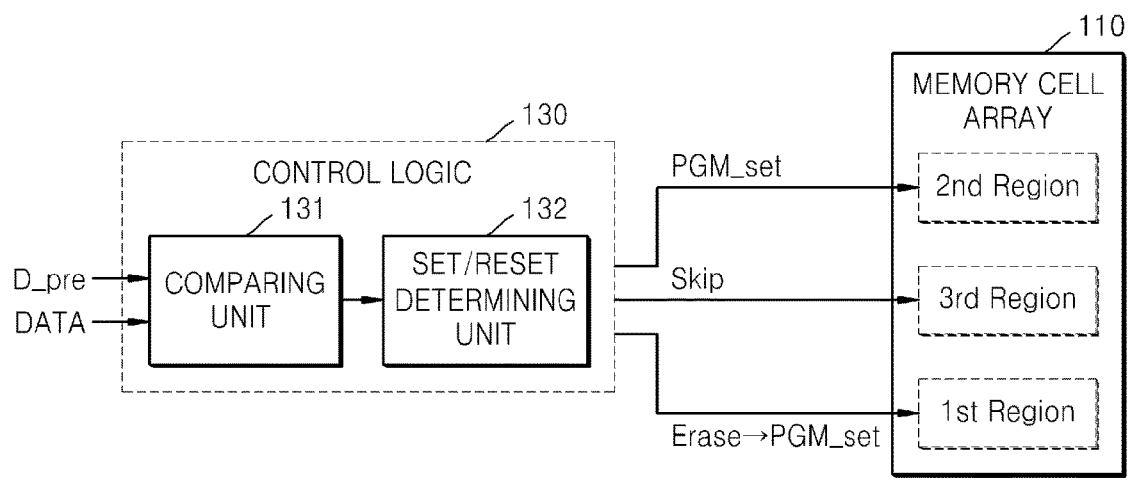
FIG. 7 is a block diagram of the memory device, which illustrates a concept of a data write operation, according to an embodiment of the inventive concept.

FIG. 7 is a block diagram of the memory device 100, which illustrates a concept of a data write operation according to an embodiment of the inventive concept. For convenience of illustration, only the control logic 130 and the memory cell array 110 are shown in FIG. 7.

The control logic 130 includes the comparing unit 131 and the set/reset determining unit 132. The control logic 130 compares write data DATA with read data D_pre, where the write data DATA is accompanied by a write command and the read data D_pre is read according to a pre-read operation, and thus determines whether to perform a set write operation or a reset write operation on each of memory cells. The control logic 130 controls, based on the determination result, a write operation with respect to the memory cell array 110.

According to the result of comparing the write data DATA and the read data D_pre, when a resistance value that corresponds to the write data DATA to be stored in a memory cell is greater than a resistance value that corresponds to the read data D_pre, the memory cell may be determined to be a memory cell (e.g., a first memory cell) on which the reset write operation will be performed. In other words, when a state that corresponds to the write data DATA is lower than a state that corresponds to the read data D_pre, the memory cell may be determined to be the first memory cell. In comparison, when a resistance value that corresponds to the write data DATA to be stored in a memory cell is less than a resistance value that corresponds to the read data D_pre, the memory cell may be determined to be a memory cell (e.g., a second memory cell) on which the set write operation will be performed. In other words, when a state that corresponds to the write data DATA is higher than a state that corresponds to the read data D_pre, the memory cell may be determined to be the second memory cell.

According to the determination results, access-target memory cells (or memory cells to which data will be written) may be divided into multiple cell regions. For example, a region that includes memory cells on which the reset write operation is to be performed may be classified as a first cell region, a region that includes memory cells on which the set write operation is to be performed may be classified as a second cell region, and a region that includes memory cells in which a state of the write data DATA is equal to a state of the read data D_pre may be classified as a third cell region. According to various embodiments, the control logic 130 controls a write operation with respect to the memory cell array 110. For example, the control logic 130 may perform the write operation by performing an erase operation on the memory cells (e.g., first memory cells) of the first cell region and then performing a set-direction programming PGM_set on the first memory cells. Also, the control logic 130 may perform the write operation by performing the set-direction programming PGM_set on the memory cells (e.g. the second memory cells) of the second region, without performing the erase operation on the second memory cells. The control logic 130 may skip the write operation on the memory cells (e.g., third memory cells) of the third cell region.

Figure 8:
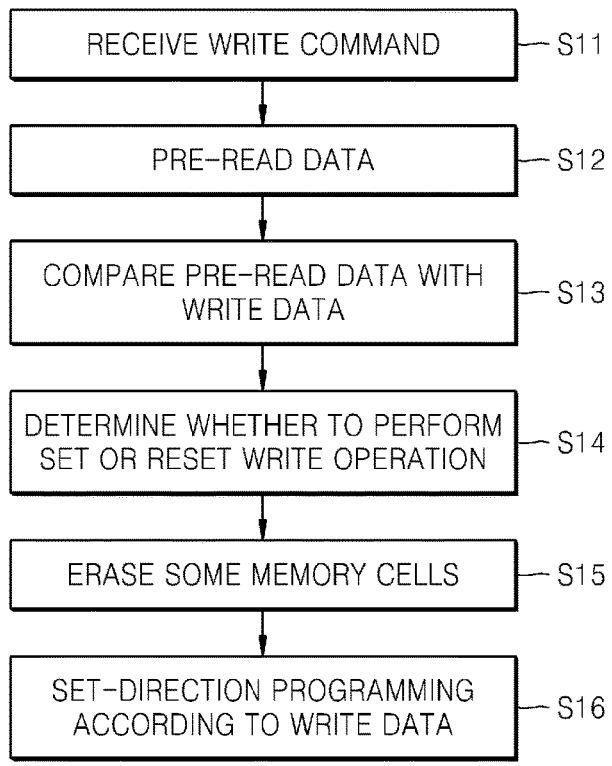
FIG. 8 is a flowchart of an operating method of a memory device, according to an embodiment of the inventive concept.

FIG. 8 is a flowchart of a method of operating a memory device, according to an embodiment of the inventive concept.

A write command requesting a data write operation on one or more memory cells is received (S11), and the memory device performs a pre-read operation on the one or more memory cells (S12), thus generating pre-read data. In order to determine whether to perform a set write operation or a reset write operation on each of the one or more memory cells, the memory device compares the pre-read data with write data that accompanies the write command (S13). The memory device determines whether to perform the set write operation or the reset write operation on each of the one or more memory cells (S14) based on the comparison. The comparing and determining operations are the same as or similar to those described in the various more embodiments.

According to the determination results, the memory device performs an erase operation on some memory cells of the one or more memory cells (S15), as described above. Since the erase operation is performed on the some memory cells (e.g., first memory cells) on which the reset write operation will be performed, resistance values of variable resistors of the first memory cells are increased to resistance values that correspond to a largest distribution (e.g., a reset state) from among multiple resistance distributions.

The memory device then performs set-direction programming on the one or more memory cells according to the write data (S16). For example, values of variable resistors of some memory cells (e.g., second memory cells) on which the set write operation will be performed are decreased from resistance values that correspond to pre-stored data to resistance values that correspond to the write data. Also, values of the variable resistors of the first memory cells are decreased from the resistance values that correspond to the reset state to resistance values that correspond to the write data. That is, an operation of programming the one or more memory cells to a state that corresponds to the write data is performed by the set-direction programming. When the reset write operation corresponds to an operation of writing data that corresponds to the largest distribution (e.g., the reset state) from among the resistance distributions, it is not necessary to perform the set-direction programming on those first memory cells.

Figure 9:
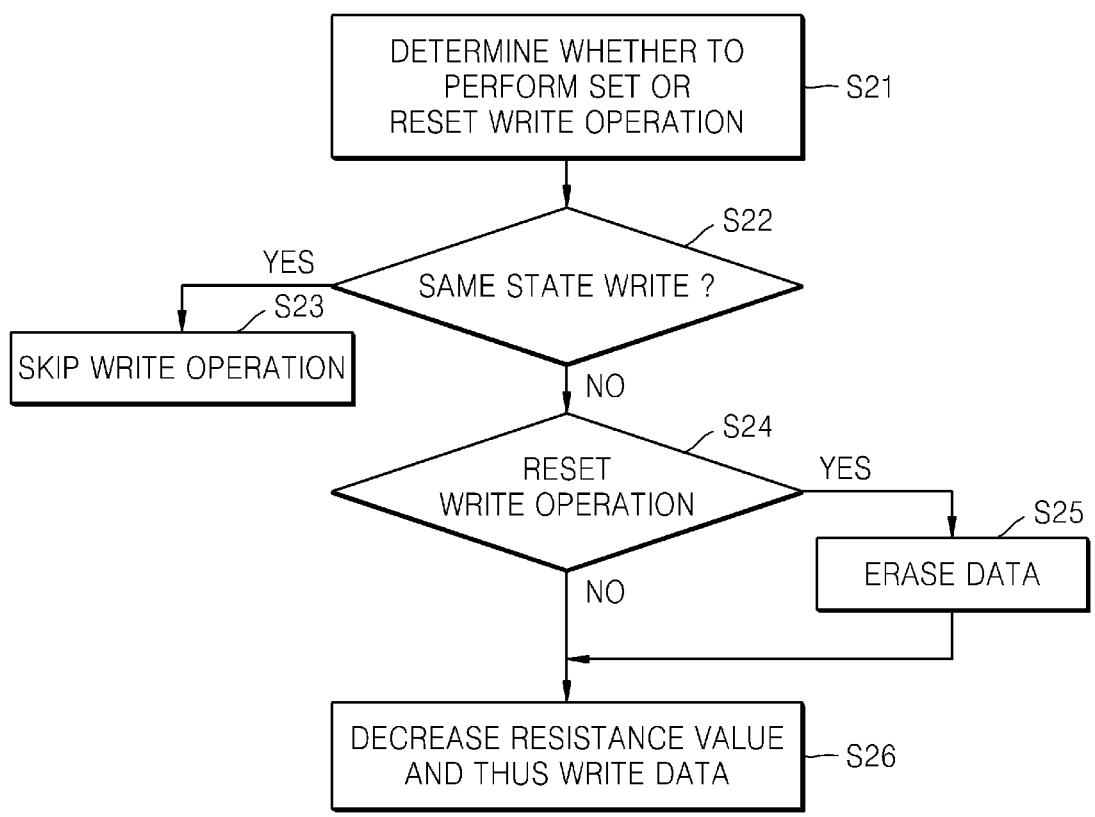
FIG. 9 is a flowchart of the determining operation in the operating method of the memory device of FIG. 8, according to an embodiment of the inventive concept.

FIG. 9 is a flowchart of the determining operation in the method of operating the memory device of FIG. 8, according to an embodiment of the inventive concept.

As illustrated in FIG. 9, the memory device performs the pre-read operation, in response to the write command and compares the write data with the pre-read data (not shown in FIG. 9), and then determines whether to perform the set write operation or the reset write operation on each of the one or more memory cells (S21). By comparing the write data with the pre-read data, the memory device may determine whether a state of the pre-read data is equal to a state of the write data (22).

When the state of the pre-read data is equal to the state of the write data, the memory device skips the write operation with respect to the memory cell (S23). When the state of the pre-read data is not equal to the state of the write data, the memory device determines whether the memory cell corresponds to a memory cell on which the reset write operation will be performed (S24).

As the determination result, when the memory cell corresponds to the memory cell on which the reset write operation will be performed, the memory device erases data stored in the memory cell (S25), and thus changes a state of the memory cell to a reset state in which a variable resistor of the memory cell has a relatively large resistance value. Then, the memory device decreases (or may perform the set-direction programming) the resistance value of the variable resistor of the memory cell of which state was changed to the reset state, and thus writes the data (S26).

When the memory cell does not correspond to the memory cell on which the reset write operation will be performed, the memory device decreases the resistance value of the variable resistor of the memory cell, without performing an erase operation, and thus writes the data (S26).

Figure 10:
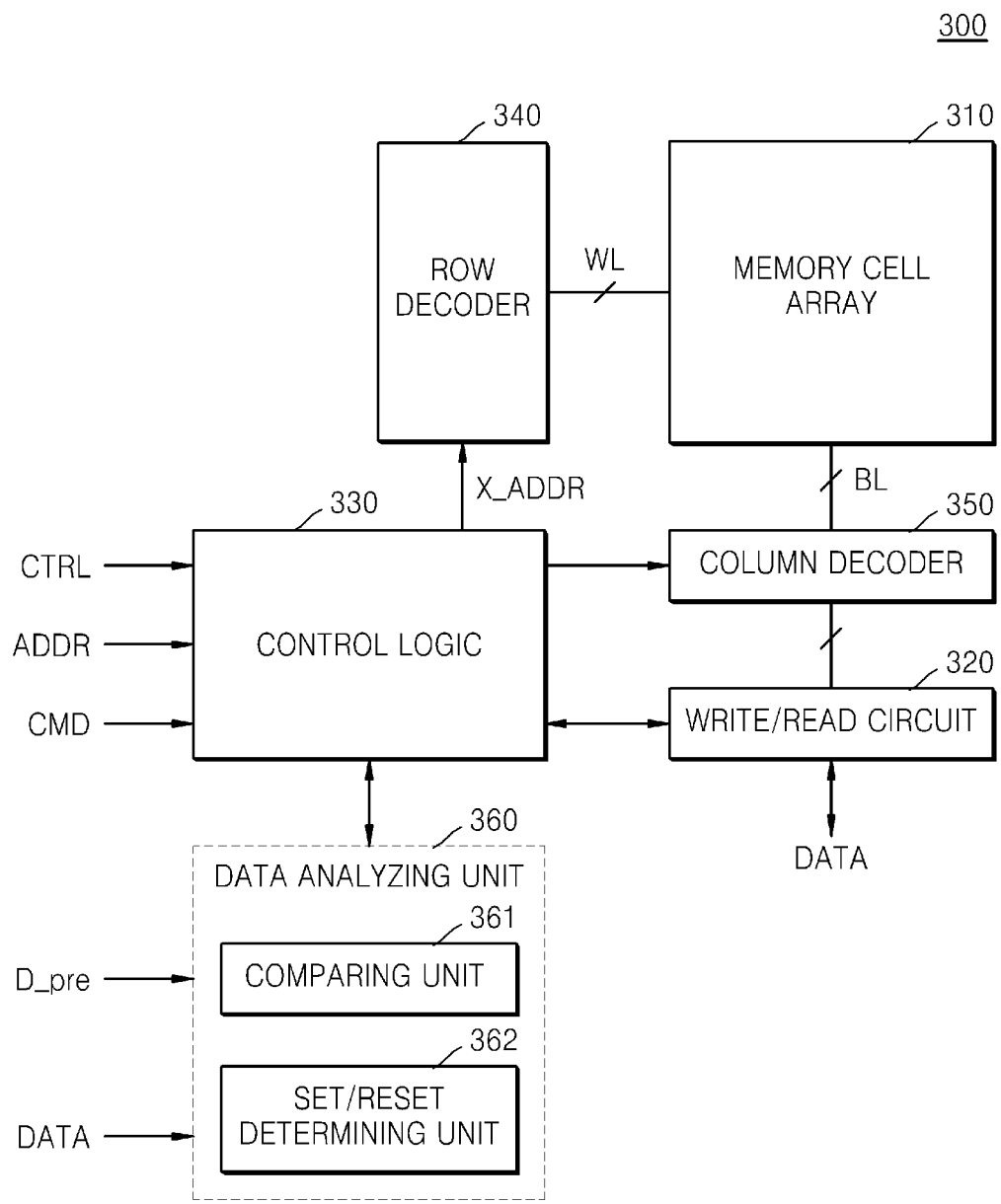
FIG. 10 is a block diagram of a memory device, according to another embodiment of the inventive concept.

FIG. 10 is a block diagram of a memory device, according to another embodiment of the inventive concept.

Referring to FIG. 10, a memory device 300 includes a memory cell array 310, a write/read circuit 320, and control logic 330. The memory device 300 further includes a row decoder 340 and a column decoder 350. In the present embodiment, the memory device 300 also includes a comparing unit for comparing pre-read data with write data, and a determining unit for determining, according to the comparison result, whether to perform a set write operation or a reset write operation on each of the memory cells. At least one of the comparing unit and the determining unit may be arranged outside the control logic 330. For example, as shown in FIG. 10, a data analyzing unit 360 for analyzing data is disposed outside the control logic 330, and includes a comparing unit 361 and a set/reset determining unit 362.

According to comparable operations described above with respect to various embodiments, the comparing unit 361 generates comparison results by comparing the pre-read data with the write data, and the set/reset determining unit 362 analyzes the comparison results, and thus determines whether a write request with respect to each of memory cells corresponds to a set write operation or a reset write operation. The determination results may be provided to the control logic 330. Based on the determination results, the control logic 330 controls the set write operation and the reset write operation with respect to the memory cells, accordingly. For example, as described above, the control logic 330 may erase data of the memory cells and may perform the reset write operation by set-direction programming, or may perform the set write operation by the set-direction programming without performing an erase operation.

Figure 11:
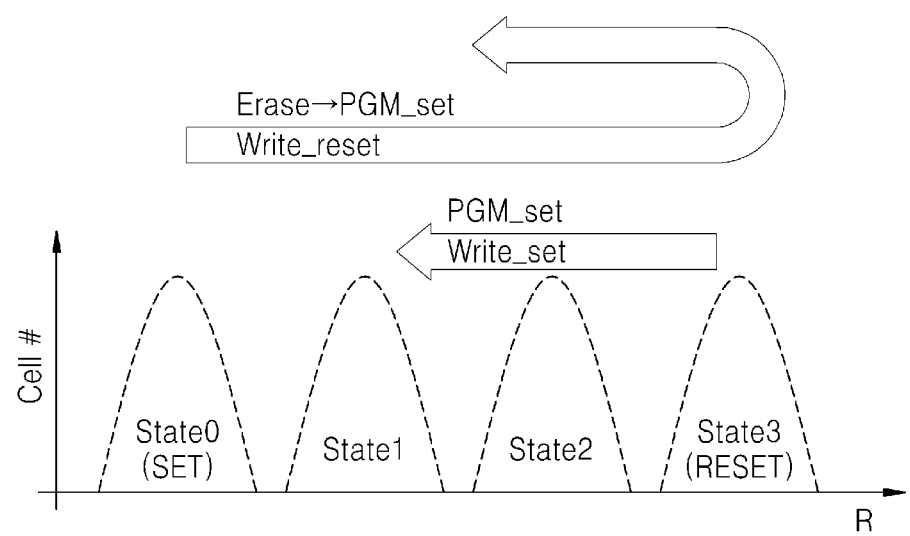
FIG. 11 is a graph that shows an example in which states of memory cells vary, according to another embodiment of the inventive concept.

FIG. 11 is a graph that shows an example in which states of memory cells vary, according to another embodiment of the inventive concept. Regarding the example of FIG. 11, it is assumed that a memory cell having a resistance value that corresponds to a smallest resistance distribution from among multiple resistance distributions has a low state (i.e., State0 or a set state SET), and a memory cell having a resistance value that corresponds to a largest resistance distribution from among the multiple of resistance distributions has a high state (i.e., State3, reset state REST or erase state).

As illustrated in FIG. 11, in a case in which a data state changes in the right direction on the graph according to a data write operation, the case may be defined as a reset write operation Write-reset, and in a case in which a data state changes in the left direction on the graph according to a data write operation, the case may be defined as a set write operation Write_set. In the reset write operation Write-reset, a state of a memory cell may be changed to an uppermost state (i.e., State3) by an erase operation. Then, after a set-direction programming PGM_set is performed, the state of the memory cell may be changed to a state lower than the erase state. Also, in the set write operation Write_set, it is not necessary to perform the erase operation, and thus the state of the memory cell may be changed to lower state by the set-direction programming PGM_set.

FIGS. 12A and 12B are graphs that show examples in which states of memory cells vary, according to embodiments of the inventive concept.

The one or more embodiments of the inventive concept may vary. For example, as in the example of FIGS. 12A and 12B, data may be written to the memory cells by performing a reset-direction programming on the memory cells, according to an embodiment of the inventive concept.

When a write command is received, a pre-read operation is performed on one or more memory cells, and a comparing operation is performed in order to compare read data with write data accompanying the write command. Then, the comparison result is analyzed, and some memory cells (e.g., first memory cells) on which a reset write operation will be performed, and other memory cells (e.g., second memory cells) on which a set write operation will be performed, is determined.

FIG. 12A shows an example of the set write operation. First, a set program is performed on the second memory cells on which the set write operation will be performed. Therefore, resistance values of the second memory cells are decreased, so that the second memory cells have uppermost states. For example, in a case where currently-stored data of a memory cell corresponds to a reset state State0, and write data corresponds to a first state State1, the memory cell is determined to be a second memory cell. Thus, a set program SET is performed on the second memory cell, such that the second memory cell has a set state State3.

Then, reset-direction programming is performed on the second memory cell, and thus a resistance value of a variable resistor of the second memory cell is increased. Therefore, a state of the second memory cell is changed to the first state State1. That is, the write data may be written to the second memory cell by the reset-direction programming.

FIG. 12B is a graph that shows an example of the reset write operation. In the present embodiment, the reset write operation may be performed by reset-direction programming, even when an erase operation or set-direction programming is not performed. As illustrated in FIG. 12B, in a case where currently-stored data of a memory cell corresponds to a set state State3, write data corresponds to a first state State1, and thus the memory cell is determined to be a first memory cell. A reset-direction programming is performed on the first memory cell, so that a resistance value of a variable resistor of the first memory cell increases, and thus a state of the first memory cell is changed.

Figure 13:
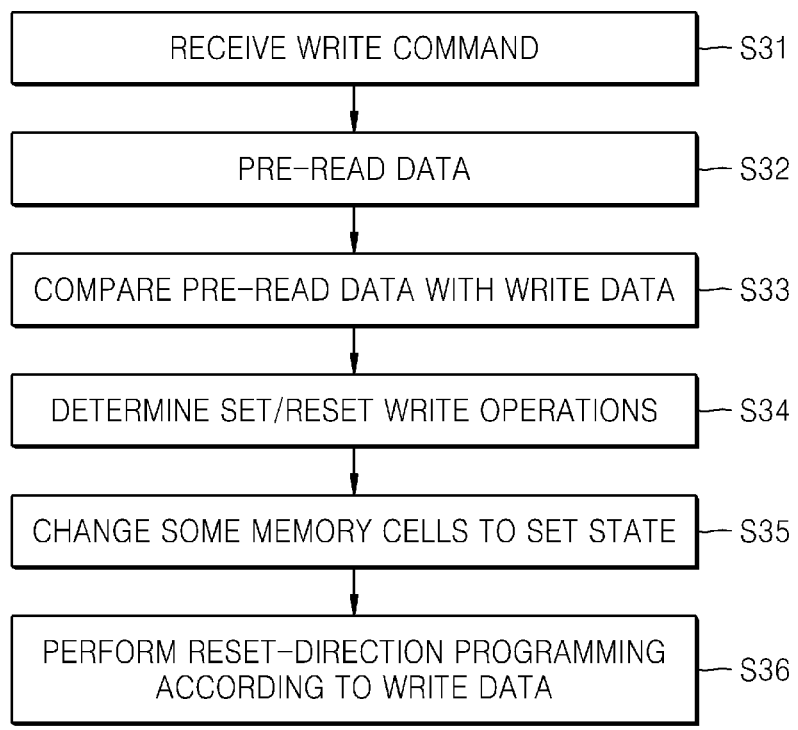
FIG. 13 is a flowchart of an operating method of a memory device, corresponding to the examples FIGS. 12A and 12B, according to an embodiment of the inventive concept.

FIG. 13 is a flowchart of a method of operating a memory device, according to an embodiment of the inventive concept, as shown in FIGS. 12A and 12B.

As illustrated in FIG. 13, the memory device receives a write command (S31), and the memory device performs a pre-read operation on access-target memory cells (S32). The pre-read data is compared with write data that accompanies the write command (S33). Also, according to the comparison results, the memory device determines one or more memory cells (e.g., first memory cells) on which a reset write operation will be performed, and one or more memory cells (e.g., second memory cells) on which a set write operation will be performed (S34).

When the first and second memory cells are determined based on the comparing and determining operations, a data write operation is performed based on the determination result. The memory device may perform set-direction programming on some memory cells from among the access-target memory cells, and thus change the states of those memory cells to a set state (S35), e.g., the memory device may change states of the second memory cells to the set state. Then, the memory device may perform reset-direction programming on the first and second memory cells according to the write data, and thus change the states of the first and second memory cells to correspond to the write data (S36).

FIGS. 14A and 14B are graphs that show a write operation, according to embodiments of the inventive concept. In the embodiments of FIGS. 14A and 14B, an erase operation is not performed on all of memory cells on which a reset write operation will be performed. Instead, according to a data analysis result, the erase operation is performed only on some memory cells from among the memory cells on which the reset write operation will be performed. For convenience of illustration, FIGS. 14A and 14B show only the reset write operation.

As illustrated in FIG. 14A, when currently-stored data of a memory cell corresponds to a set state State3, and write data corresponds to a first state State1, the reset write operation is performed as below. According to states of the currently-stored data and the write data, an erase operation may or may not be performed. For example, when the state of the write data is lower than the state of the currently-stored data by at least two stages, the erase operation may be skipped. In comparison, when the state of the write data is lower than the state of the currently-stored data by one stage, and thus is close to the state of the currently-stored data, the erase operation may be performed. However, in an embodiment, the erase operation may be performed or may be skipped according to another condition. In particular, when the memory cell is a multilevel cell that stores data of at least 3 bits, a condition of the erase operation may be variously set.

When the state of the currently-stored data corresponds to a set state State3, for example, and the state of the write data corresponds to a first state State1, the write data may be written to the memory cell by a reset-direction programming, without the erase operation. That is, as depicted on the graph showing current and voltage characteristics (FIG. 5), the difference between a voltage level that corresponds to the set state State3 and a voltage level that corresponds to the first state State1 is relatively greater than the difference between voltage levels when the state of the write data is close to the state of the currently-stored data, in which case it is relatively easy to control the reset write operation. Accordingly, even when the reset write operation is performed as in the embodiment of FIG. 14A, if the state of the write data is lower than the state of the currently-stored data by at least two stages, the write data may be written to the memory cell by the reset-direction programming, without the erase operation.

On the other hand, as illustrated in FIG. 14B, when a state of currently-stored data of a memory cell corresponds to a second state State2, and a state of a write data corresponds to a first state State1, for a reset write operation, an erase operation may be performed on the memory cell. Since the erase operation is performed, the state of the memory cell may be changed to an erase state State0, and then, set-direction programming is performed on the memory cell so that the state of the memory cell may be changed to the first state State1. As described in the one or more embodiments, in the embodiments of FIGS. 14A and 14B, a set write operation may be performed by set-direction programming, without an erase operation.

The write operation of the memory device may include a set write operation period and a reset write operation period. The reset-direction programming of FIG. 14A and the erase operation of FIG. 14B may be performed together during the reset write operation period. In the present embodiment, the number of the memory cells on which the erase operation will be performed may be further decreased.

Figure 15:
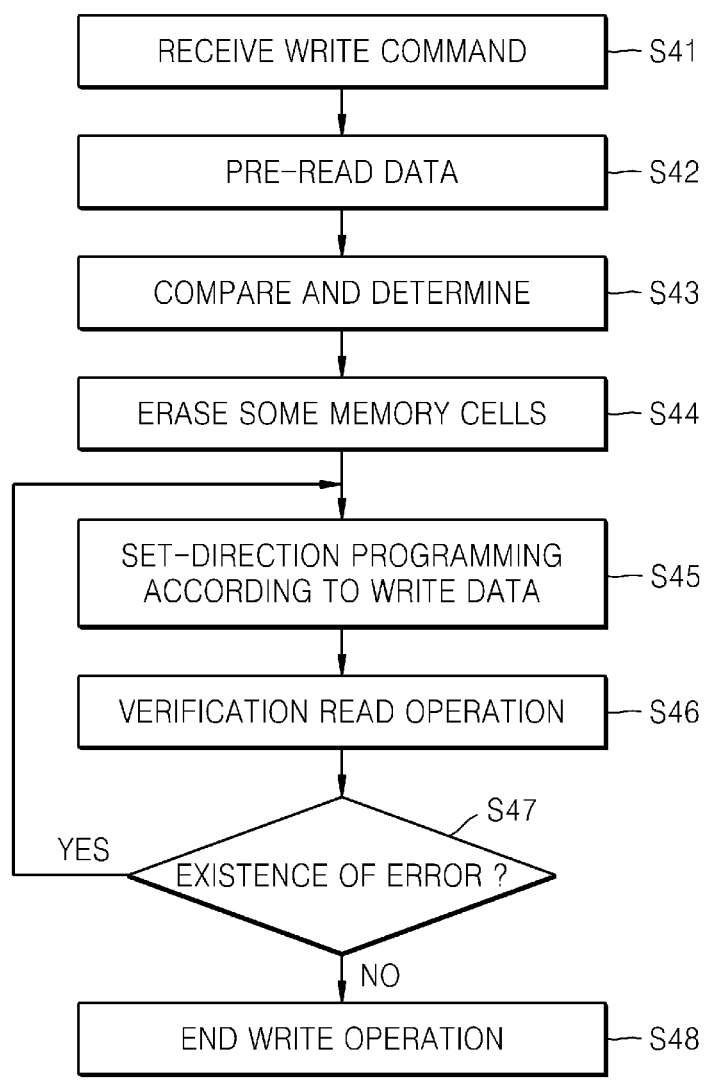
FIG. 15 is a flowchart of an operating method of a memory device, according to another embodiment of the inventive concept.

FIG. 15 is a flowchart of a method of operating a memory device, according to another embodiment of the inventive concept.

As illustrated in FIG. 15, the memory device receives a write command (S41) and performs, in response to the write command, a pre-read operation on access-target memory cells (S42). Then, the memory device compares the pre-read data with the write command and determines the comparison result (S43). According to the comparison and determination results, one or more first memory cells are determined on which a reset write operation will be performed and one or more second memory cells are determined on which a set write operation will be performed.

Similar other embodiments, the memory device performs an erase operation on some memory cells (e.g., the first memory cells) of the access-target memory cells (S44), and then performs set-direction programming on at least some of the first memory cells and second memory cells according to the write data (S45). Since the set-direction programming is performed, the write data is written. For verification of the written data, the memory device performs a verification read operation (S46). According to the result of the verification read operation, the memory device determines whether a write error exists in a memory cell (S47). If a write error exists, the memory device may repeatedly perform the set-direction programming and the verification read operation, again determining whether a write error exists. According to the verification result, if a write error does not exist, the memory device ends the write operation (S48).

Figure 16:
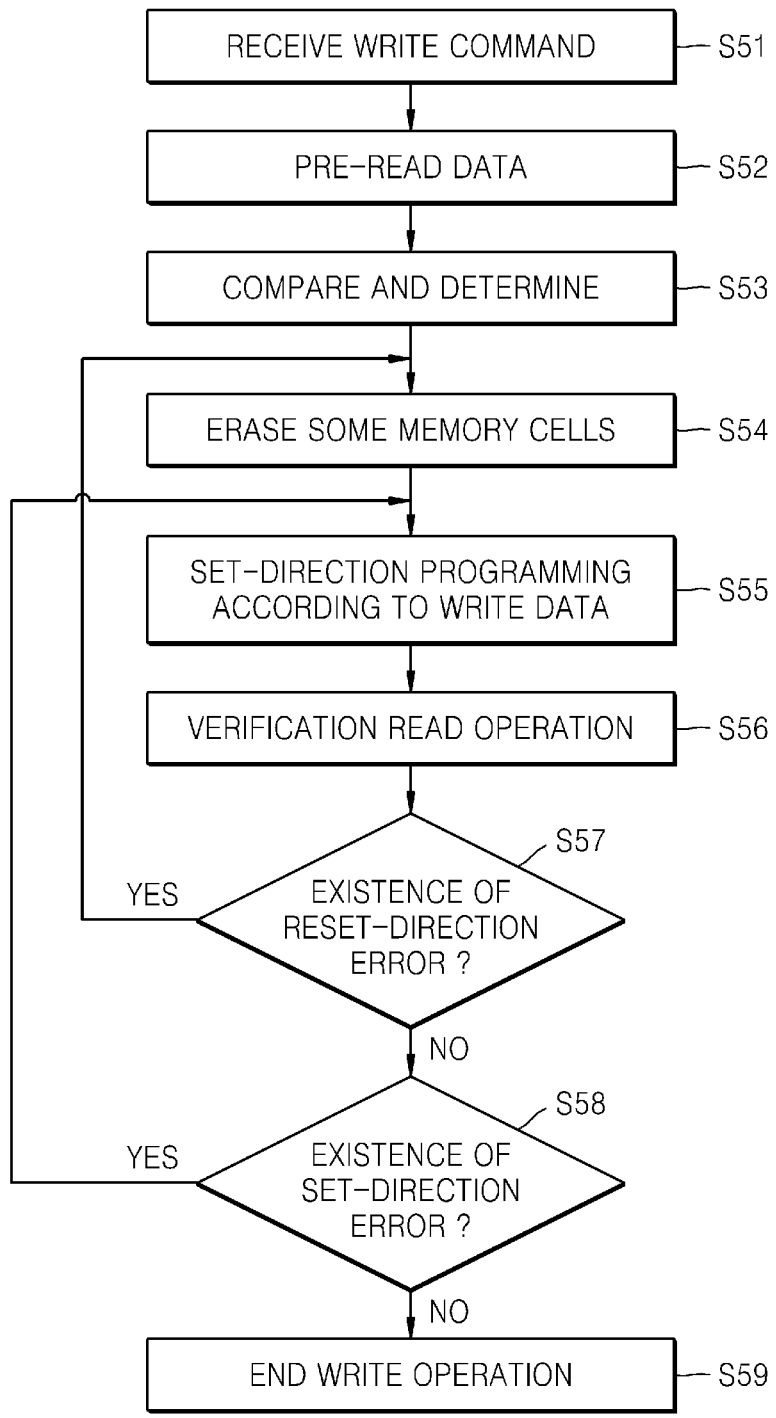
FIG. 16 is a flowchart of a method of operating a memory device, according to another embodiment of the inventive concept.

FIG. 16 is a flowchart of a method of operating a memory device, according to another embodiment of the inventive concept.

As illustrated in FIG. 16, similar to other embodiments, in response to a write command, the memory device writes data to one or more memory cells by performing set-direction programming, and performs a verification read operation on the write data. That is, the write command is received (S51), the data is pre-read in response to the write command (S52), and the pre-read data and write data that accompanies the write command are compared to determined the difference (S53). Depending on the determination, an erase operation may be performed on some memory cells (e.g., first memory cells) (S54). The set-direction programming is performed on the write data (S55), and the verification read operation is performed (S56).

As a result of the verification read operation, the memory device determines whether a reset-direction error exits in the first memory cells (S57). The reset-direction error may occur when data of the first memory cells is not normally erased by the erase operation. If a reset-direction error exits, the memory device may re-perform an erase operation on the first memory cells, set-direction programming, and the verification read operation. After the verification process, if the memory device determines that a reset-direction error does not exit, the memory device determines whether a set-direction error exists, so as to determine whether the data is normally written to the first memory cells by the set-direction programming (S58).

The set-direction error may occur when states of the first memory cells are not normally changed from an erase state to a higher state, or when states of second memory cells are not normally changed from a current state to a higher state. As a result of the determination regarding the set-direction error, if a set-direction error exists, the memory device may repeatedly perform the set-direction programming, and the verification read operation for determining existence of a set-direction error. As a result of determination whether a set-direction error exists, if no memory cell has a set-direction error, the memory device ends the write operation (S59). In the present embodiment, according to types of error, the error may be differently repaired in each of the memory cells, and thus, in the verification write operation, data may be written to the memory cells by the set-direction programming.

Figure 17A:
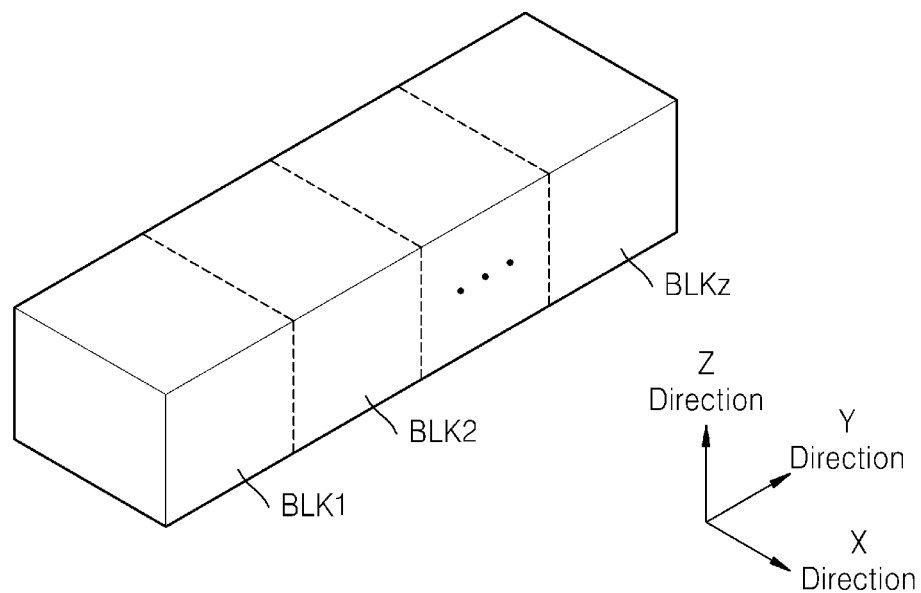
FIGS. 17A and 17B are a structure diagram and a circuit diagram of the memory cell array of FIG. 1, respectively, according to an embodiment of the inventive concept.
Figure 17B:
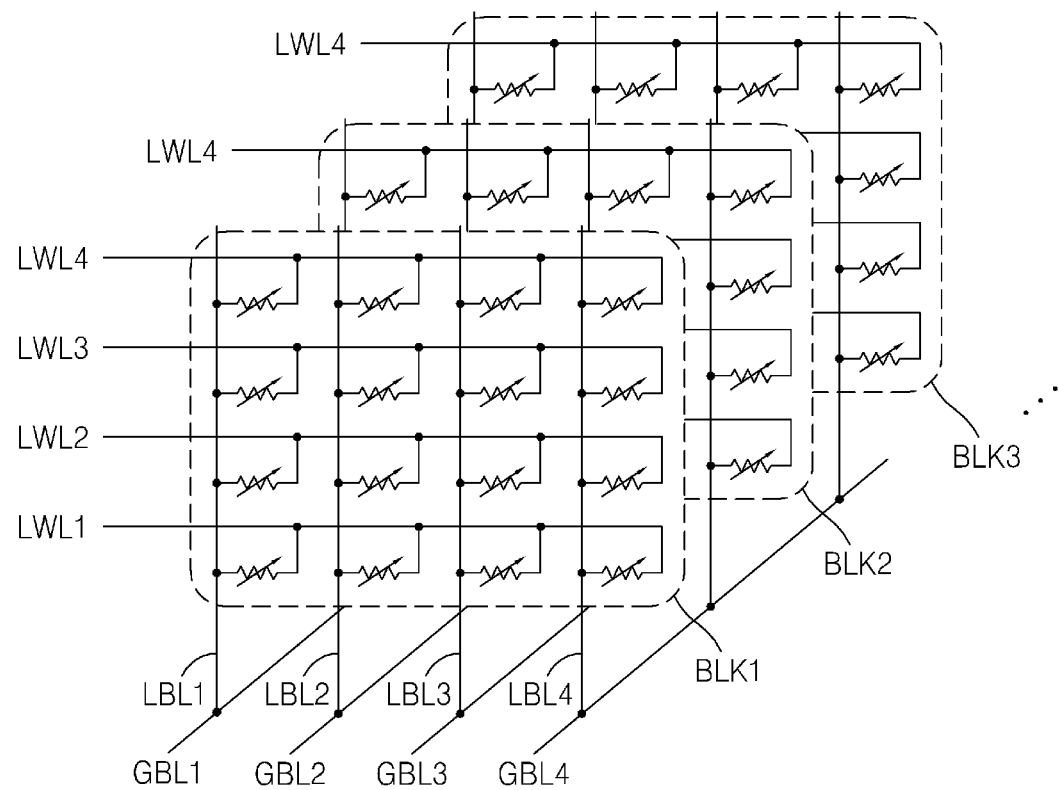

FIGS. 17A and 17B are a structure diagram and a circuit diagram of the memory cell array 110 of FIG. 1, respectively, according to an embodiment of the inventive concept.

Referring to FIGS. 17A and 17B, the memory cell array 110 includes multiple memory blocks BLK1 through BLKz. Each of the memory blocks BLK1 through BLKz has a three-dimensional structure (or a vertical structure). Also, each of the memory blocks BLK1 through BLKz may include multiple cell strings that extend in a direction perpendicular to a substrate. Cell strings of one memory block may be connected to bit lines, one or more string selection lines, and word lines. The cell strings of the memory blocks BLK1 through BLKz may share bit lines BL.

FIG. 17B illustrates an example in which the memory blocks BLK1 through BLKz of FIG. 17A are embodied. For convenience of illustration, FIG. 17B does not show a selection device that may be embodied as a diode or a transistor, for example.

Referring to FIG. 17B, the memory cell array 110 includes representative memory blocks BLK1 through BLKz that are three-dimensionally stacked. Also, the memory cell array 110 includes multiple local bit lines LBL1 through LBL4 that extend in parallel in a Z-axis direction, and multiple local word lines LWL1 through LWL4 that extend in parallel in a Y-axis direction that is perpendicular to the Z-axis direction. Also, the local bit lines LBL1 through LBL4 may be connected to global bit lines GBL1 through GBL4.

Referring to the first memory block BLK1, memory cells of the memory cell array 110 are connected between the local word lines LWL1 through LWL4 and the local bit lines LBL1 through LBL4, respectively. A write operation or a read operation may be performed on the memory cells by a current (or a voltage) that is applied to the local word lines LWL1 through LWL4 and/or the local bit lines LBL1 through LBL. In the present embodiment, a current (or a voltage) that is applied to the local word lines LWL1 through LWL4 and the local bit lines LBL1 through LBL4 may be provided to allow the write operation according to various embodiments herein. For example, for memory cells on which a reset write operation will be performed, an erase current (or an erase voltage) may be provided to allow an erase operation to be first performed on the memory cells, and then a write current (or a write voltage) for set-direction programming may be provided. Also, in relation to the embodiments that are described with reference to FIGS. 1 through 16, one embodiment may be commonly applied to the memory blocks BLK1 through BLKz, or various embodiments may be applied to the memory blocks BLK1 through BLKz, respectively.

Figure 18:
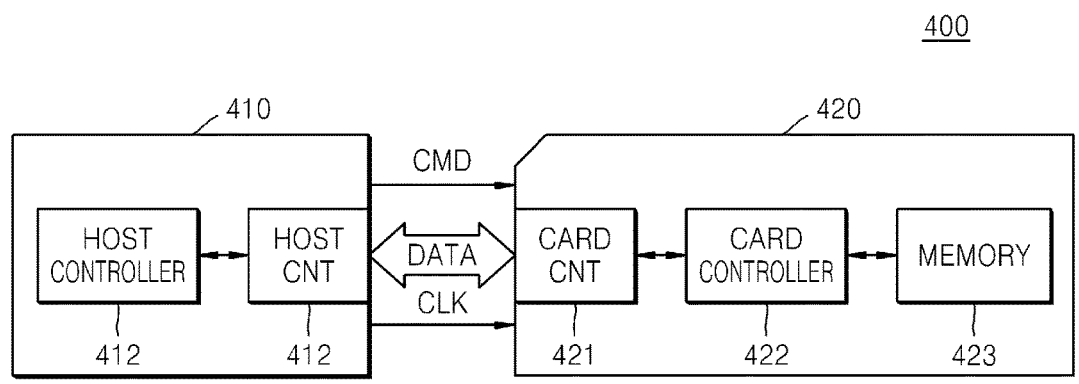
FIG. 18 is a block diagram of a memory card system having a resistive memory system applied thereto, according to an embodiment of the inventive concept.

FIG. 18 is a block diagram of a memory card system having a resistive memory system applied thereto, according to an embodiment of the inventive concept.

Referring to FIG. 18, a memory card system 400 includes a host 410 and a memory card 420. The host 410 includes a host controller 411 and a host connector 412. The memory card 420 includes a card connector 421, a card controller 422, and a memory device 423. Here, the memory device 423 may be implemented according to various embodiments shown in FIGS. 1 through 16, so that the memory device 423 may compare and determine write data and pre-read data, perform an erase operation on memory cells on which a reset write operation will be performed, and then write data on the memory cells by set-direction programming.

The host 410 may write data to the memory card 420 or may read data stored in the memory card 420. The host controller 411 may transmit a command CMD, a clock signal CLK generated by a clock generator (not shown) in the host 410, and data DATA to the memory card 420 via the host connector 412.

In response to the command CMD received via the card connector 421, the card controller 422 may store the data DATA in the memory device 423, in synchronization with a clock signal that is generated by a clock generator (not shown) in the card controller 422. The memory device 423 may store the data DATA that is transmitted from the host 410.

The memory card 420 may be embodied as a compact flash card (CFC), a microdrive, an SMC, an MMC, a Security Digital Card (SDC), a memory stick, or a USB flash memory drive, for example.

Figure 19:
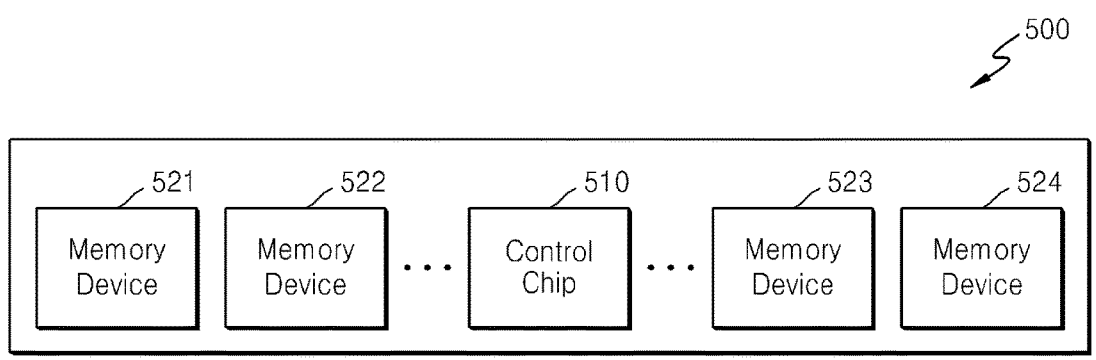
FIG. 19 illustrates a resistive memory module, according to an embodiment of the inventive concept.

FIG. 19 illustrates a resistive memory module, according to an embodiment of the inventive concept. Referring to FIG. 19, a resistive memory module 500 includes memory devices 521 through 524, and a control chip 510. Each of the memory devices 521 through 524 may be implemented according to various embodiments shown in FIGS. 1 through 16. In response to signals transmitted by an external memory controller, the control chip 510 controls the memory devices 521 through 524. For example, according to various commands and addresses that are transmitted from an external source (not shown), the control chip 510 may activate the memory devices 521 through 524 corresponding to the various commands and addresses, and thus control write and read operations. Also, the control chip 510 may perform various post processing operations on read data output from each of the memory devices 521 through 524, e.g., the control chip 510 may perform error detection and correction operations on the read data.

According to the present embodiment, in response to a write command, each of the memory devices 521 through 524 may compare and determine write data and pre-read data, perform an erase operation only on memory cells on which a reset write operation will be performed, and write data on the memory cells by set-direction programming.

Figure 20:
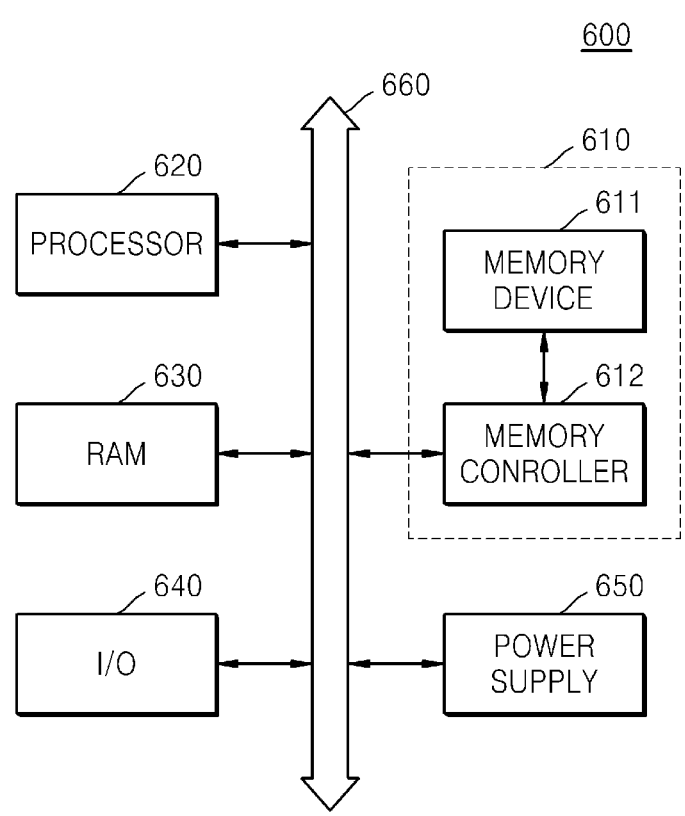
FIG. 20 is a block diagram of a computing system including a resistive memory system, according to an embodiment of the inventive concept.

FIG. 20 is a block diagram of a computing system including a resistive memory system, according to an embodiment of the inventive concept.

Referring to FIG. 20, a computing system 600 includes a memory system 610, a processor 620, RAM 630, an input/output (I/O) device 640, and a power supply device 650. The memory system 610 includes a memory device 611 and a memory controller 622. Although not illustrated in FIG. 20, the computing system 600 may further include ports capable of communicating with a video card, a sound card, a memory card, or a USB device, or other electronic devices. The computing system 600 may be embodied as a PC, or a portable electronic device, such as a notebook computer, a mobile phone, a personal digital assistant (PDA), or a camera, for example.

The processor 620 may perform particular calculations or tasks. In various embodiments, the processor 620 may be a micro-processor, a Central Processing Unit (CPU), or the like. The processor 620 may perform communication with the RAM 630, the I/O device 640, and the memory system 610 via a bus 660, such as an address bus, a control bus, or a data bus, for example. Here, the memory system 610 and/or the RAM 630 may be implemented according to various embodiments shown in FIGS. 1 through 16.

In one or more embodiments, the processor 620 may also be connected to an extended bus, such as a Peripheral Component Interconnect (PCI) bus.

The RAM 630 may store data for operations of the computing system 600. As described above, the memory device according to the various embodiments of the inventive concept may be applied to the RAM 630. Alternatively, a DRAM, a mobile DRAM, an SRAM, a PRAM, a FeRAM, or an MRAM may be used as the RAM 630, for example.

The I/O device 640 may also include an input unit (not shown), such as a keyboard, a keypad, or a mouse, and an output unit (not shown), such as a printer or a display. The power supply device 650 may supply an operating voltage for the operations of the computing system 600.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of operating a resistive memory device, the method comprising:
performing a pre-read operation on memory cells in response to a write command; and
executing the write command by:
performing an erase operation on one or more first memory cells on which a reset write operation is to be performed according to the write command, as determined based on a result of comparing pre-read data acquired from the pre-read operation with write data of the write command; and
performing set-direction programming on at least some memory cells from among the erased one or more first memory cells and on one or more second memory cells on which a set write operation is to be performed according to the write command,
wherein:
the erase operation comprises increasing, to the highest of three or more resistance states, the resistance state of each of the one or more first memory cells, a resistance state of each of the one or more first memory cells is increased by executing the write command, and
the set-direction programming comprises:
decreasing the resistance state of each of the at least some memory cells to one of the three or more resistance states that is less than the highest resistance state, and
decreasing the resistance state of each of the one or more second memory cells without increasing its resistance state during the execution of the write command, a resistance state of each of the one or more second memory cells is decreased by executing the write command.

2. The method of claim 1, wherein:
each of the one or more first memory cells and the one or more second memory cells comprises a variable resistor, and
the reset write operation is a write operation that increases a resistance value of the variable resistor, and the set write operation is a write operation that decreases the resistance value of the variable resistor.

3. The method of claim 2, wherein resistance values of the variable resistors of the one or more first memory cells are increased by the erase operation, and then are decreased by the set-direction programming, whereby the reset write operation is performed on the one or more first memory cells.

4. The method of claim 2, wherein resistance values of the variable resistors of the one or more second memory cells are decreased by the set-direction programming, whereby the set write operation is performed on the one or more second memory cells.

5. The method of claim 1, wherein:
each of the one or more first memory cells and the one or more second memory cells is a multilevel cell having a resistance value that corresponds to one of a plurality of resistance distributions, and
by performing the erase operation, the one or more first memory cells have resistance values that correspond to a largest resistance distribution from among the plurality of resistance distributions.

6. The method of claim 1, wherein:
each of the one or more first memory cells and the one or more second memory cells is a multilevel cell having a resistance value that corresponds to one of a plurality of resistance distributions, and
according to a result of comparing the pre-read data with the write data, when a resistance value that corresponds to the write data is greater than a resistance value that corresponds to the pre-read data, a memory cell for storing the write data is determined to be a first memory cell, and when the resistance value that corresponds to the write data is smaller than the resistance value that corresponds to the pre-read data, the memory cell for storing the write data is determined to be a second memory cell.

7. The method of claim 1, further comprising:
performing a verification read operation on the at least some memory cells on which the set-direction programming has been performed; and
according to a verification result, again performing the set-direction programming on one or more verification-failed memory cells.

8. The method of claim 1, further comprising:
performing a verification read operation on the at least some memory cells on which the set-direction programming has been performed; and
according to a verification result, again performing the erase operation and the set-direction programming on one or more verification-failed first memory cells.

9. The method of claim 1, wherein a write operation is skipped with respect to one or more third memory cells in which the write data is determined to be equal to the pre-read data based on the result of comparing the pre-read data from the pre-read operation with the write data.

10. A method of operating a resistive memory device comprising a plurality of resistive memory cells, the method comprising:
performing a pre-read operation on the plurality of resistive memory cells, in response to a write command; and
executing the write command by:
increasing, to the highest of three or more resistance states, the resistance state of each of one or more first memory cells among the resistive memory cells, a resistance state of each of the one or more first memory cells is increased by executing the write command;
decreasing the resistance state of each of the one or more first memory cells from the highest resistance state to one of the three or more resistance states that is less than the highest resistance state; and
decreasing the resistance state of each of one or more second memory cells among the resistive memory cells without increasing its resistance state during the execution of the write command, a resistance state of each of the one or more second memory cells is decreased by executing the write command.

11. The method of claim 10, further comprising:
comparing write data with pre-read data; and
according to a result of comparing the write data with the pre-read data, determining the one or more first memory cells and the one or more second memory cells from among the plurality of resistive memory cells.

12. The method of claim 10, wherein:
a variable resistor arranged in each of the plurality of resistive memory cells has a resistance value that corresponds to one of a plurality of resistance distributions, and
the resistance value of the first variable resistor in each of the one or more first memory cells is increased so as to correspond to a largest resistance distribution from among the plurality of resistance distributions, and then is decreased.

13. The method of claim 11, wherein a write operation is skipped with respect to one or more third memory cells, in which the write data is equal to the pre-read data, according to a result of comparing write data with pre-read data.

14. The method of claim 10, wherein:
a variable resistor arranged in each of the plurality of resistive memory cells has a resistance value that corresponds to one of a plurality of resistance distributions, and
a write operation is completed by increasing a resistance value of a variable resistor of one or more fourth memory cells to a resistance value that corresponds to a largest resistance distribution from among the plurality of resistance distributions, wherein data that corresponds to the largest resistance distribution from among the plurality of resistance distributions is to be written to the fourth memory cell.

15. The method of claim 10, wherein:
a variable resistor arranged in each of the plurality of resistive memory cells has a resistance value that corresponds to one of a plurality of resistance distributions, and
a write operation is completed by increasing a resistance value of a variable resistor of one or more fifth memory cells, according to a result of comparing write data with pre-read data, wherein the resistance value of the variable resistor of the fifth memory cell is increased from a resistance value corresponding to a first resistance distribution to a resistance value corresponding to a second resistance distribution that is not adjacent to the first resistance distribution.

16. A method of operating a resistive memory device comprising a memory cell array including a plurality of resistive memory cells, each of the plurality of resistive memory cells comprising a variable resistor, the method comprising:
comparing a plurality of pieces of write data to be written to the plurality of resistive memory cells, respectively, with a plurality of pieces of data that are read from the plurality of resistive memory cells, respectively;
determining, from the comparisons, a first cell region of the memory cell array that comprises resistive memory cells of which resistance values of the variable resistors are to be increased by a write operation, and a second cell region of the memory cell array that comprises resistive memory cells of which resistance values of the variable resistors are to be decreased by the write operation; and
executing a write command by:
decreasing, to the lowest of three or more resistance states, the resistance state of each of the resistive memory cells of the second cell region, each of the resistive memory cells of the second cell region having a resistance state that is lower than a first resistance state among the three or more resistance states,
increasing the resistance state of each of resistive memory cells of the second cell region from the lowest resistance state to one of the three or more resistance states that is greater than the lowest resistance state, and
increasing the resistance state of each of the resistive memory cells of the first cell region without decreasing its resistance state during the execution of the write command, each of the resistive memory cells of the first cell region having a resistance state that is not lower than the first resistance state.

17. The method of claim 16, wherein:
each of the plurality of resistive memory cells has a resistance value that corresponds to one of a plurality of resistance distributions,
the resistance values of the variable resistors of the resistive memory cells of the second cell region are changed to resistance values that correspond to a smallest resistance distribution from among the plurality of resistance distributions, and
the resistive memory cells of the first and second cell regions are then programmed in a direction in which the resistance values of the variable resistors of the resistive memory cells are increased.

18. The method of claim 16, wherein decreasing, to the lowest of the three or more resistance states, the resistance state of each of the resistive memory cells of the second cell region constitutes an erase operation.

* * * * *